US009076903B2

(12) United States Patent
Yuan et al.

(10) Patent No.: US 9,076,903 B2
(45) Date of Patent: *Jul. 7, 2015

(54) FORMING HIGH-EFFICIENCY SILICON SOLAR CELLS USING DENSITY-GRADED ANTI-REFLECTION SURFACES

(71) Applicant: Alliance for Sustainable Energy, LLC, Golden, CO (US)

(72) Inventors: Hao-Chih Yuan, Lakewood, CO (US); Howard M. Branz, Boulder, CO (US); Matthew R. Page, Littleton, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/150,221

(22) Filed: Jan. 8, 2014

(65) Prior Publication Data

US 2014/0127850 A1 May 8, 2014

Related U.S. Application Data

(63) Continuation of application No. 12/797,590, filed on Jun. 9, 2010.

(51) Int. Cl.
*H01L 21/00* (2006.01)
*H01L 31/0236* (2006.01)
(Continued)

(52) U.S. Cl.
CPC .......... *H01L 31/02327* (2013.01); *H01L 33/44* (2013.01); *H01L 31/02167* (2013.01);
(Continued)

(58) Field of Classification Search
CPC ............... H01L 31/1804; H01L 31/022425; H01L 31/02167; H01L 1/02168; H01L 31/022458; H01L 31/02363; H01L 31/1864; H01L 31/1868; H01L 33/44; H01S 5/0282
USPC ......... 438/37–38, 45, 87, 317, 342, 343, 346; 257/E21.05
See application file for complete search history.

(56) References Cited

U.S. PATENT DOCUMENTS

| 4,111,762 A | 9/1978 | Wade et al. |
| 5,196,088 A | 3/1993 | Soda |

(Continued)

FOREIGN PATENT DOCUMENTS

| JP | 2000261008 | 9/2000 |
| JP | 2005277208 | 6/2005 |

(Continued)

OTHER PUBLICATIONS

Branz et al., "Nanostructured Black Silicon and the Optical Reflectance of Graded-Density Surfaces," Applied Physics Letters vol. 94, Issue 23, Jun. 2009, pp. 231121 (1-3).

(Continued)

*Primary Examiner* — Thanhha Pham
(74) *Attorney, Agent, or Firm* — John C. Stolpa; Suzanne C. Walts; Michael A. McIntyre

(57) ABSTRACT

A method (50) is provided for processing a graded-density AR silicon surface (14) to provide effective surface passivation. The method (50) includes positioning a substrate or wafer (12) with a silicon surface (14) in a reaction or processing chamber (42). The silicon surface (14) has been processed (52) to be an AR surface with a density gradient or region of black silicon. The method (50) continues with heating (54) the chamber (42) to a high temperature for both doping and surface passivation. The method (50) includes forming (58), with a dopant-containing precursor in contact with the silicon surface (14) of the substrate (12), an emitter junction (16) proximate to the silicon surface (14) by doping the substrate (12). The method (50) further includes, while the chamber is maintained at the high or raised temperature, forming (62) a passivation layer (19) on the graded-density silicon anti-reflection surface (14).

22 Claims, 11 Drawing Sheets

(51) Int. Cl.
*H01L 31/0232* (2014.01)
*H01L 33/44* (2010.01)
*H01L 31/0216* (2014.01)
*H01L 31/068* (2012.01)
*H01L 31/18* (2006.01)

(52) U.S. Cl.
CPC .... *H01L31/02168* (2013.01); *H01L 31/02363* (2013.01); *H01L 31/068* (2013.01); *H01L 31/1804* (2013.01); *Y02E 10/547* (2013.01)

(56) References Cited

U.S. PATENT DOCUMENTS

| | | |
|---|---|---|
| 5,250,460 A | 10/1993 | Yamagata et al. |
| 5,264,375 A | 11/1993 | Bang et al. |
| 6,093,941 A | 7/2000 | Russell et al. |
| 6,178,033 B1 | 1/2001 | Ford et al. |
| 6,284,317 B1 | 9/2001 | Laibinis et al. |
| 6,329,296 B1 | 12/2001 | Ruby et al. |
| 6,538,801 B2 | 3/2003 | Jacobson et al. |
| 6,721,083 B2 | 4/2004 | Jacobson et al. |
| 6,759,313 B2 | 7/2004 | Yamazaki et al. |
| 6,762,134 B2 | 7/2004 | Bohn et al. |
| 6,790,785 B1 | 9/2004 | Li et al. |
| 6,899,816 B2 | 5/2005 | Padhi et al. |
| 6,905,622 B2 | 6/2005 | Padhi et al. |
| 7,052,587 B2 | 5/2006 | Gibson et al. |
| 7,090,783 B1 | 8/2006 | Cui et al. |
| 7,135,414 B2 | 11/2006 | Matsumura et al. |
| 7,141,490 B2 | 11/2006 | Yamazaki et al. |
| 7,476,573 B2 | 1/2009 | Cohen |
| 7,585,786 B2 | 9/2009 | Goo et al. |
| 7,718,254 B2 | 5/2010 | Matsumura et al. |
| 7,833,391 B2 | 11/2010 | Fan et al. |
| 8,053,270 B2 | 11/2011 | Dimitrov et al. |
| 8,053,328 B2 | 11/2011 | Cohen |
| 8,075,792 B1 | 12/2011 | Branz et al. |
| 8,119,438 B2 | 2/2012 | Nishimoto |
| 8,124,535 B2 | 2/2012 | Lin et al. |
| 8,193,095 B2 | 6/2012 | Lin et al. |
| 8,334,216 B2 | 12/2012 | Lin et al. |
| 8,486,843 B2 | 7/2013 | Li et al. |
| 2002/0068421 A1 | 6/2002 | Yamazaki et al. |
| 2002/0104552 A1 | 8/2002 | Bay |
| 2002/0123227 A1 | 9/2002 | Winningham et al. |
| 2002/0145792 A1 | 10/2002 | Jacobson et al. |
| 2003/0096113 A1 | 5/2003 | Jacobson et al. |
| 2003/0119332 A1 | 6/2003 | Kuebelbeck et al. |
| 2003/0190812 A1 | 10/2003 | Padhi et al. |
| 2004/0100594 A1 | 5/2004 | Huibers et al. |
| 2004/0100677 A1 | 5/2004 | Huibers et al. |
| 2004/0241967 A1 | 12/2004 | Yamazaki et al. |
| 2005/0056118 A1 | 3/2005 | Xia et al. |
| 2005/0101153 A1 | 5/2005 | Matsumura et al. |
| 2005/0130439 A1 | 6/2005 | Goo et al. |
| 2005/0137531 A1 | 6/2005 | Prausnitz et al. |
| 2005/0271805 A1 | 12/2005 | Kambe et al. |
| 2006/0281333 A1 | 12/2006 | Shin et al. |
| 2006/0281334 A1 | 12/2006 | Shin et al. |
| 2007/0121205 A1 | 5/2007 | Miles |
| 2007/0148922 A1 | 6/2007 | Yamazaki et al. |
| 2007/0152234 A1 | 7/2007 | Yamamoto et al. |
| 2007/0155021 A1 | 7/2007 | Zhang et al. |
| 2007/0155022 A1 | 7/2007 | Yamakawa et al. |
| 2007/0184576 A1 | 8/2007 | Chang et al. |
| 2007/0190326 A1 | 8/2007 | Perry et al. |
| 2007/0206267 A1 | 9/2007 | Tung et al. |
| 2007/0247620 A1 | 10/2007 | Koo |
| 2007/0281249 A1 | 12/2007 | Tutt et al. |
| 2009/0026070 A1 | 1/2009 | Fan et al. |
| 2009/0107545 A1 | 4/2009 | Moslehi |
| 2009/0183776 A1 | 7/2009 | Kwag et al. |
| 2009/0236317 A1 | 9/2009 | Yost et al. |
| 2009/0293946 A1 | 12/2009 | Lin et al. |
| 2010/0187123 A1 | 7/2010 | Bocarsly et al. |
| 2010/0248449 A1 | 9/2010 | Hildreth et al. |
| 2010/0270263 A1 | 10/2010 | Li et al. |
| 2010/0270650 A1 | 10/2010 | Li et al. |
| 2010/0296986 A1 | 11/2010 | Feyh |
| 2011/0030610 A1 | 2/2011 | Kamian et al. |
| 2011/0045627 A1 | 2/2011 | Sachs et al. |
| 2011/0143484 A1 | 6/2011 | Lin et al. |
| 2011/0240997 A1 | 10/2011 | Rockenberger et al. |
| 2011/0303265 A1 | 12/2011 | Oh et al. |
| 2011/0316134 A1 | 12/2011 | Tsao et al. |
| 2012/0024365 A1 | 2/2012 | Branz et al. |
| 2012/0088372 A1 | 4/2012 | Chien et al. |
| 2012/0103825 A1 | 5/2012 | Oh et al. |
| 2012/0178204 A1 | 7/2012 | Toor et al. |
| 2012/0225517 A1 | 9/2012 | Zhang et al. |
| 2013/0052762 A1 | 2/2013 | Li et al. |

FOREIGN PATENT DOCUMENTS

| | | |
|---|---|---|
| JP | 2005183505 | 7/2005 |
| JP | 2007305748 | 11/2007 |
| JP | 2009209420 | 9/2009 |
| WO | 03105209 | 12/2003 |
| WO | 2005059985 | 6/2005 |
| WO | 2006051727 | 5/2006 |
| WO | 2007083152 | 7/2007 |
| WO | 2007025536 | 8/2007 |
| WO | 2009117642 | 9/2009 |
| WO | 2011060193 | 5/2011 |
| WO | 2011161479 | 12/2011 |
| WO | 2013142122 | 9/2013 |

OTHER PUBLICATIONS

Yuan, et al., "Efficient Black Sikocon Solar Cell With a Density-Graded Nanoporous Surface; Optical Properties, Performance Limitations, and Design Rules," Applied Physics Letters vol. 95, Issue 12, Sep. 2009, pp. 123501 (1-3).

Toor et al, "Multi-Surface Texture to Improve Blue Response of Nanoporous Black Silicon Solar Cells," Applied Physics Letters vol. 99, Issue 10, Sep. 2011, pp. 10103501 (1-3).

Lee, et al., "Extremely Superhydraphobic Surfaces With Micro- and Nanostructures Fabricated by Copper Catalytice Etching," Langmuir Article, vol. 27, Issue 2, Jan. 18, 2011, pp. 809-814.

Huang et al., "Metal-Assited Electrochemical Etching of Silicon," Nanotechnology, vol. 21, Nov. 19, 2010 pp. 465301 (1-6).

Peng et al., "Fabrication of Single-Crystalline Silicon Nanowires y Scratching a Silicon Surface With Catalytic Metal Particles," Advanced Functional Materials, vol. 16, Issue 3, Feb. 2006, pp. 387-394.

Lee et al., "Patterning of Various Silicon Structures Via Polymer Lithography and Catalytic Chemical Etching," Nanotechnology, vol. 22, Issue 27, Jul. 8, 2011, pp. 275305 (1-6).

Liu et al., "Efficient SERS Substrates Made by Electroless Silver Deposition Into Patterned Silicon Structures," Journal of Material Chemistry, vol. 14, Issue 10, Apr. 21, 2004 (1st published on line), pp. 1526-1532.

Tsujino et al., "Texturization of Multicyrstalline Silicon Wafers for Solar Cells by Chemical Treatment Using Metallic Catalyst," Solar Energy Materials & Solar Cells, vol. 90, issue 1, Jan. 2006, pp. 100-110.

Li et al., "Metal-Assisted Chemical Etching in HF/H2O2 Procedures Porous Silicon," Applied Physics Letters vol. 77, Issue16, Oct. 2000, pp. 2573-2574.

Nishioka et al., "Antirefleclion Subwavelength Structure of Silicon Surface Formed by Wet Process Using Catalysis of Single Nano-sized Gold Particle," Solar Energy Materials and Solar Cells, vol. 92, Issue 8, Aug. 2008, pp. 919-922.

Putnam et al., "10um minority-carrier diffusion lengths in Si Wires snythesized by Cu-catalyzed vapor-liquid-solid growth," Applied Physics Letters, vol. 95, Issue 16, Oct. 19, 2009, pp. 163116-1-163116-3.

(56) References Cited

OTHER PUBLICATIONS

Kuzuma-Filipek et al., ">16% Thin-film epitaxial silicon solar cells on 70-cm2 area with 30-us active layer, porous silicon back reflector, and Cu-based top-contact metallization," Progress in Photovoltaics: research and applications, vol. 20, Issue 3, May 2012, pp. 350-355.

Nishioka et al, "Nano-sized Taper Structure Formed by Wet Process Using Catalysis of God Nanoparticle," School of Material Science, Japan Advanced Institute of Science and Technology, MRS Fall Meeting 2007.

Koynov et al., "Black multi-crystalline silicon solar cells," Rapid Research Letters, vol. 1, Issue 2, Oct. 2006, pp. R53-R55.

Koynov et al, "Black nonreflecting silicon surfaces for solar cells," Applied Physics Letter, vol. 88, Issue 30, May 2006, pp. 203107-1-3.

Kumaravelu et al., "Surface Texturing for Silicon Solar Cells Using Reactive Ion Etching Technique," Photovoltaic Specialist Conference, 29th IEEE, May 19-24, 2002, pp. 258-261.

PCT/US09/37776 International Search Report and Written Opinion dated Sep. 28, 2009.

PCT/US09/37776 International Preliminary Report on Patentability dated Sep. 21, 2010.

PCT/US13/30257 International Search Report and Written Opinion dated May 16, 2013.

Japanese Application No. 500974/2011 Office Action dated Mar. 13, 2012 with English translation.

Chinese Application No. 200980110274.3 Office Action dated Dec. 25, 2012 with English translation.

Chinese Application No. 200980110274.3 Office Action dated Jun. 27, 2013 with English translation.

Chinese Application No. 200980110274.3 Office Action dated Jul. 10, 2012 with English translation.

Chinese Application No. 200980110274.3 Office Action dated Dec. 11, 2011 with English translation.

Menna et al, "Porous silicon in solar cells: A review and a description of its application as an AR coating," Solar Energy Materials and Solar Cells, vol. 37, Issue 1, Apr. 1995, pp. 13-24.

Li, et al, "Hydrogen generation from photoelectrochemical water splitting based on nanomaterials," Laser Photonics Rev. vol. 4, Issue 4, Jun. 2010, pp. 517-528.

Sai, et al., "Wide-Angle Antireflection Effect of Subwavelength Structures for Solar Cells," Japan Journal of Applied Physics, vol. 46, No. 6A, Jun. 2007, pp. 3333-3336.

Stephens, "Optical Reflectance and Transmission of a Textured Surface," Thin Solid Films, vol. 45, Issue 1, Aug. 1977, pp. 19-29.

Yu, "Fabrication of large area subwavelength antireflection structures on Si using trilayer resist nanoimprint lithography and liftoff," J. Vac. Sci. Technol. B 21, 2874, Dec. 2003.

Charter et al, "Metal-assisted chemical etching of silicon in HF-H2O2," Electrochimica Acta, vol. 53, Issue 17, Jul. 2008, pp. 5509-5516.

Kelly, et al, "Design and characterization of a robust photoelectrochemical device to generate hydrogen using solar water splitting," Intl Journal of Hydrogen Energy, vol. 31, Issue 12, Sep. 2006, pp. 1658-1673.

Koshida, et al, "Photoelectrochemical Behavior of n-Type Porous-Si Electrodes," Japanese Journal of Applied Physics, 25, No. 7, Jul. 1986, pp. 1069-1072.

PCT/US10/56417 International Search Report and Written Opinion dated Jan. 25, 2011.

Xiu et al., "Superhydrophobic and Low Light Reflectivity Silicon Surfaces Fabricated by Hierarchical Etching," Langmuir vol. 24, Issue 18, Sep. 16, 2008, pp. 10421-10426.

Yoo et al., "Black silicon layer formation form application in solar cells," Solar Energy Materials & Solar Cells, vol. 90, Issues 18-19, Nov. 23, 2006, pp. 3085-3093.

U.S. Appl. No. 13/825,541 Restriction Requirement dated Oct. 11, 2013.

U.S. Appl. No. 13/432,745 Non Final Office Action dated Oct. 8, 2013.

U.S. Appl. No. 12/053,444 Non Final Office Action dated Sep. 16, 2011.

U.S. Appl. No. 12/053,444 Non Final Office Action dated Apr. 4, 2012.

U.S. Appl. No. 12/053,444 Non Final Office Action dated Nov. 26, 2012.

U.S. Appl. No. 12/053,444 Final Office Action dated Jun. 6, 2013.

U.S. Appl. No. 12/797,590 Restriction Requirement dated Aug. 15, 2012.

U.S. Appl. No. 12/797,590 Non Final Office Action dated Nov. 27, 2012.

U.S. Appl. No. 12/797,590 Non Final Office Action dated Sep. 10, 2013.

U.S. Appl. No. 13/825,541 Non Final Office Action dated Dec. 26, 2013.

US 9,076,903 B2

FORMING HIGH-EFFICIENCY SILICON SOLAR CELLS USING DENSITY-GRADED ANTI-REFLECTION SURFACES

CROSS-REFERENCE TO RELATED APPLICATIONS

This application is a Continuation Application of, and claims priority to and benefit of, U.S. patent application Ser. No. 12/797,590, entitled "FORMING HIGH-EFFICIENCY SILICON SOLAR CELLS USING DENSITY-GRADED ANTI-REFLECTION SURFACES" and filed on Jun. 9, 2010, which is incorporated herein by reference in its entirety.

CONTRACTUAL ORIGIN

The United States Government has rights in this invention under Contract No. DE-AC36-08GO28308 between the United States Department of Energy and the Alliance for Sustainable Energy, LLC, the Manager and Operator of the National Renewable Energy Laboratory.

BACKGROUND

Despite numerous attempts at making better solar cells with new and exotic materials, the photovoltaics market is still dominated by early or first generation solar cells that are typically silicon wafer-based solar cells. Most solar cell manufacturers are equipped to produce silicon wafer-based solar cells, and research continues to design silicon-based solar cells that can achieve higher conversion efficiencies without an exorbitant increase in production costs, e.g., the aim of research often is to achieve the lowest cost per watt solar cell design that is suitable for commercial production. In addition to use in solar cells, silicon wafers, other silicon layers on substrates, and objects having silicon surfaces are used in numerous other applications such as in electronic devices, telecommunication devices, computers, and even in biological or medical applications. These other applications have also driven research to methods of fabricating silicon wafers and silicon surfaces with particular qualities or characteristics such as a rough, textured, or nanostructured surface.

The performance of solar cells and other optoelectronic devices is directly related to optical losses caused by high reflectivity. Flat silicon surfaces such as those found on an untreated silicon wafer have a high natural reflectivity across the entire range of the solar spectrum that results in losses of light that could otherwise be converted to electrical energy by the silicon photovoltaic device. To produce high efficiency solar cells, researchers have sought ways to minimize reflection losses.

While etching processes produce highly non-reflective or "black" silicon surfaces, there are a number of drawbacks that may hinder wide adoption of such processes. A silicon device with a black silicon surface or region is useful because it is rough or fuzzy to a depth of about a wavelength of light, but this irregular, porous region has a large amount of surface area when compared with a flat or planar silicon surface. Generally, in solar cells and some other applications, large amounts of surface area are considered undesirable as it may result in loss of photogenerated minority carriers that leads to a reduction in light detection efficiency or energy conversion efficiency. Stated another way, the use of black silicon or density graded layers or regions to control reflection does not make sense in terms of dollar-per-Watt unless high energy conversion efficiency can be achieved. Accordingly, it would still be desirable to develop techniques that allow the large, irregular surface area of the black silicon to be passivated (e.g., to provide surface passivation) that do not significantly increase manufacturing complexity, fabrication times, and material or other manufacturing costs for high-efficiency silicon solar cells, detectors, and other devices.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods that are meant to be exemplary and illustrative, not limiting in scope. In various embodiments, one or more of the above-described problems have been reduced or eliminated, while other embodiments are directed to other improvements.

Briefly, a method is provided that is useful in performing surface passivation of a black silicon region or anti-reflective (AR) porous Si surface (e.g., a graded-density surface, region, or layer) of a silicon wafer or substrate. Such black silicon regions or surfaces are desirable for effectively reducing reflectivity but present large surface areas on the silicon wafer or substrate that has to be passivated to produce a high-efficiency silicon device such as a silicon solar cell. In some implementations, the method integrates passivation with the diffusion or doping step used to process the silicon wafer or substrate to provide an emitter junction (or with another processing step). In this manner, an additional manufacturing step is not required in that the surface passivation and diffusion/doping may be performed during a single high temperature operation (e.g., raise the temperature of the chamber once and perform doping and then passivation).

For example, the method may involve emitter homo-junction formation on the silicon wafer or substrate with $POCl_3$ or the like, and this results in the wafer having an emitter junction but also a dopant-containing layer over the graded-density AR surface. Then, with the chamber temperature still raised (e.g., over 700° C. such as in a range about 850° C.), surface passivation is performed by injecting a volume of gaseous oxygen, water vapor, or another oxygen source into the chamber, which results in the growth of a passivation layer (e.g., silicon oxide) on the graded-density AR surface (with the oxygen diffusing through the dopant-containing layer). In this method, the dopant-byproduct layer (e.g., phosphorus silicate glass (PSG)) is left in place or retained over the passivation layer with little or no increase in reflectivity. Hence, the method eliminates a separate high-temperature passivation step and also eliminates the step of stripping the PSG or other dopant materials from the wafer or substrate.

In one exemplary, but not limiting, embodiment, a method is provided for processing a graded-density AR silicon surface to provide effective surface passivation. The method includes positioning a substrate or wafer with a silicon surface in a reaction or processing chamber. The silicon surface has been processed (e.g., etched or laser treated) to be an AR surface with a density gradient (e.g., a graded-density silicon surface or a region of black silicon). The method continues with heating the chamber to a temperature in a high-temperature processing range such as a range of 700 to 1150° C. useful for both doping and surface passivation. The method includes forming, with a dopant-containing precursor in contact with the wafer surface (i.e., with the AR surface), an emitter junction proximate to the silicon surface by doping the substrate. The method further includes, while the chamber is maintained at the high or raised temperature, forming a passivation layer on the graded-density silicon anti-reflection surface.

In the method, a dopant-containing layer may be formed on the silicon surface during the formation of the emitter junction, and, in such cases, the passivation layer may be formed or grown with the dopant-containing layer left in place such that the passivation layer is sandwiched between the dopant-containing layer and the graded-density silicon AR surface. In other cases, the dopant-byproduct may first be stripped away. In some cases, the dopant-containing precursor is $POCl_3$ while other applications may use other precursors such as boron nitride, $BBr_3$, $PH_3$, $B_2H_6$, GaN, $AsH_3$, $SbH_3$, TMB, and spin-on dopants for B, Ga, P, or Sb, or other precursors. The passivation layer may be formed by flowing oxygen or water vapor into the high-temperature chamber such that the passivation layer is made up of silicon dioxide.

In addition to the exemplary aspects and embodiments described above, further aspects and embodiments will become apparent by reference to the drawings and by study of the following descriptions.

BRIEF DESCRIPTION OF THE DETAILED DRAWINGS

Exemplary embodiments are illustrated in referenced figures of the drawings. It is intended that the embodiments and figures disclosed herein are to be considered illustrative rather than limiting.

Figure 4:
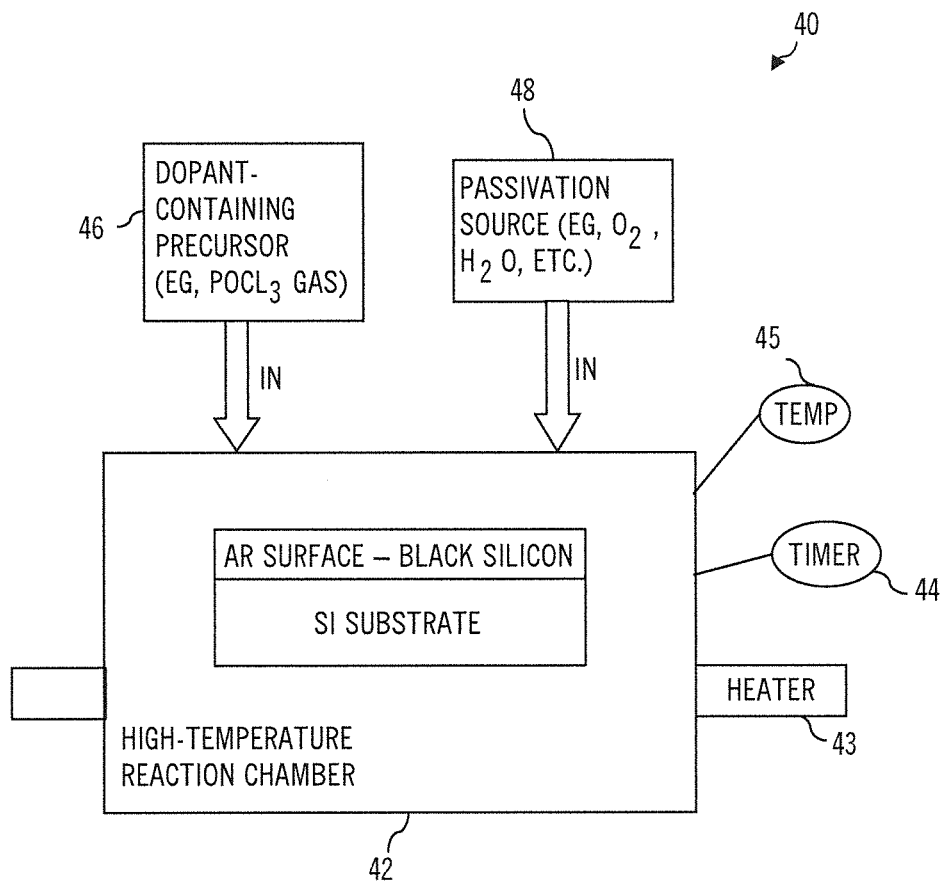

FIG. 4 illustrates in schematic or functional block form an exemplary Si device processing system for use in fabricating a high-efficiency Si device such as a Si solar cell, a Si detector, and the like in which a Si substrate or wafer that includes a porous AR surface or region (e.g., region of black silicon) is both doped to form an emitter homo-junction in and/or near the AR surface or region and processed to provide surface passivation of the AR surface.

Figure 5A:
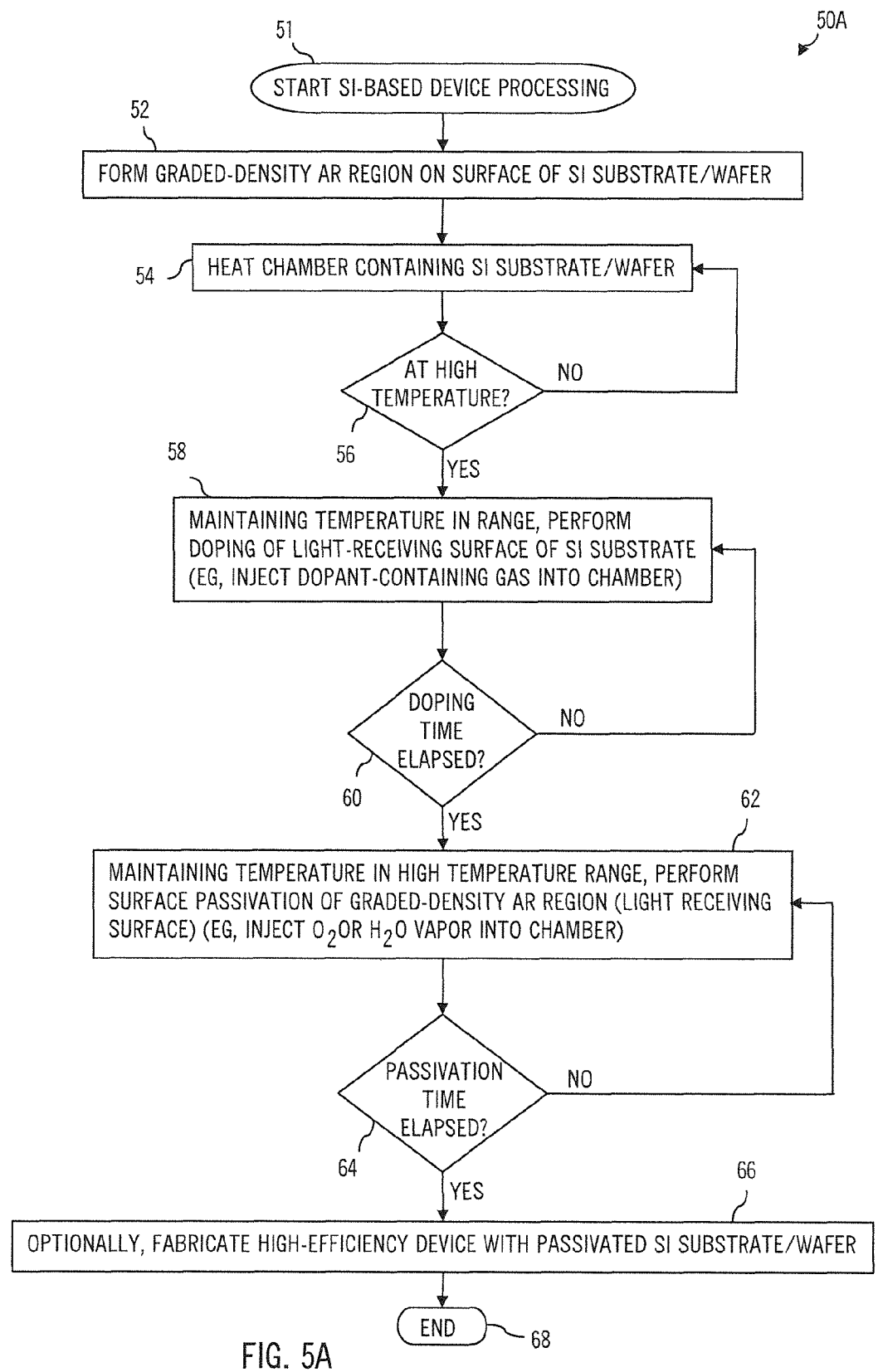
Figure 5B:
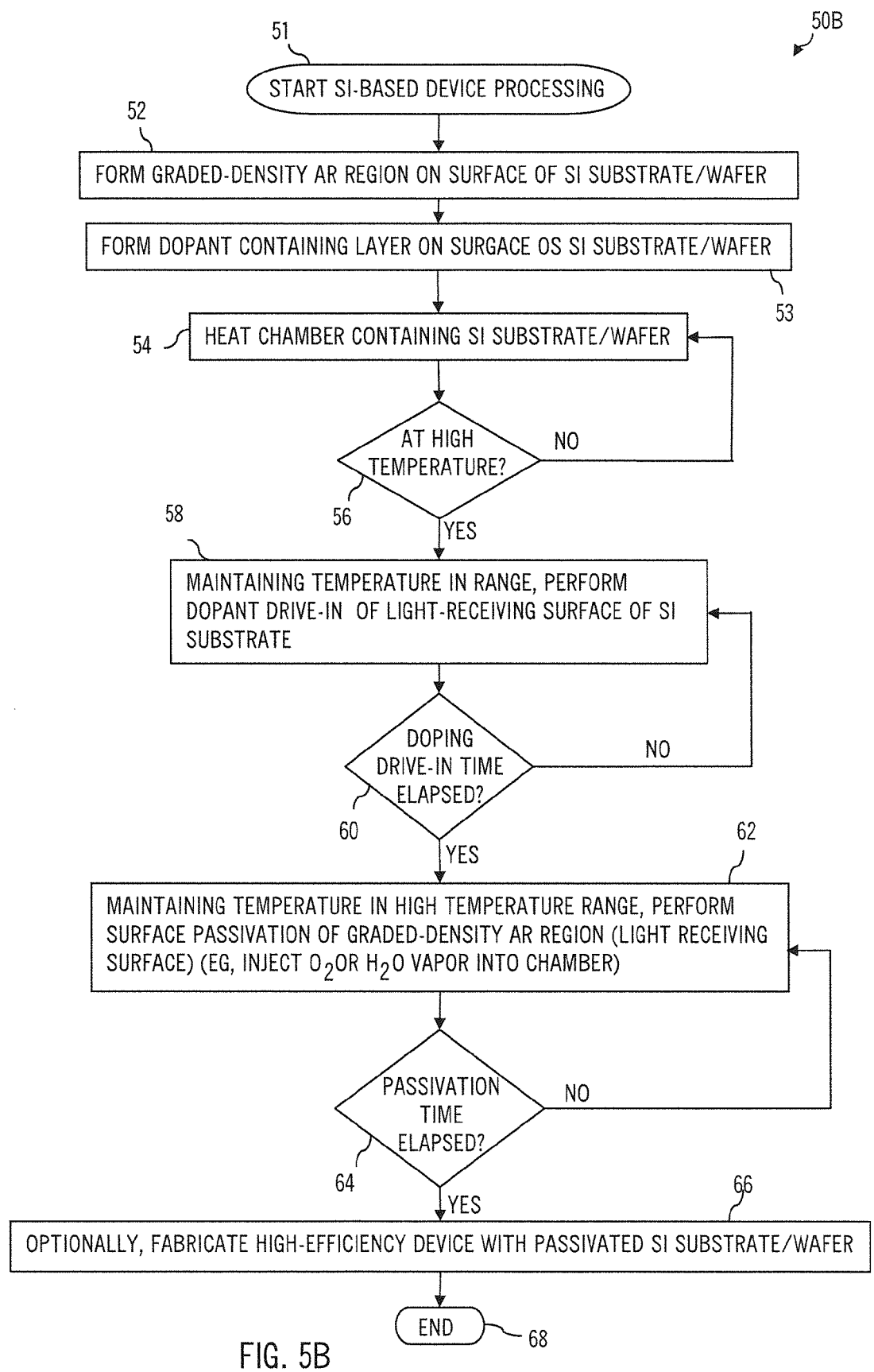

FIG. 5A is a flow chart showing exemplary process steps that may be performed during operation of the system of FIG. 4 to provide surface passivation of the black silicon or graded-density surface without removing or stripping away the dopant-containing byproduct layer from the Si device (e.g., without removal of the PSG or similar materials or material layer);

FIG. 5B is a flow chart showing exemplary process steps for operation of the system of FIG. 4 similar to that shown in FIG. 5A but utilizing spin-on dopants (SOD) as the source of dopants.

Figure 6:
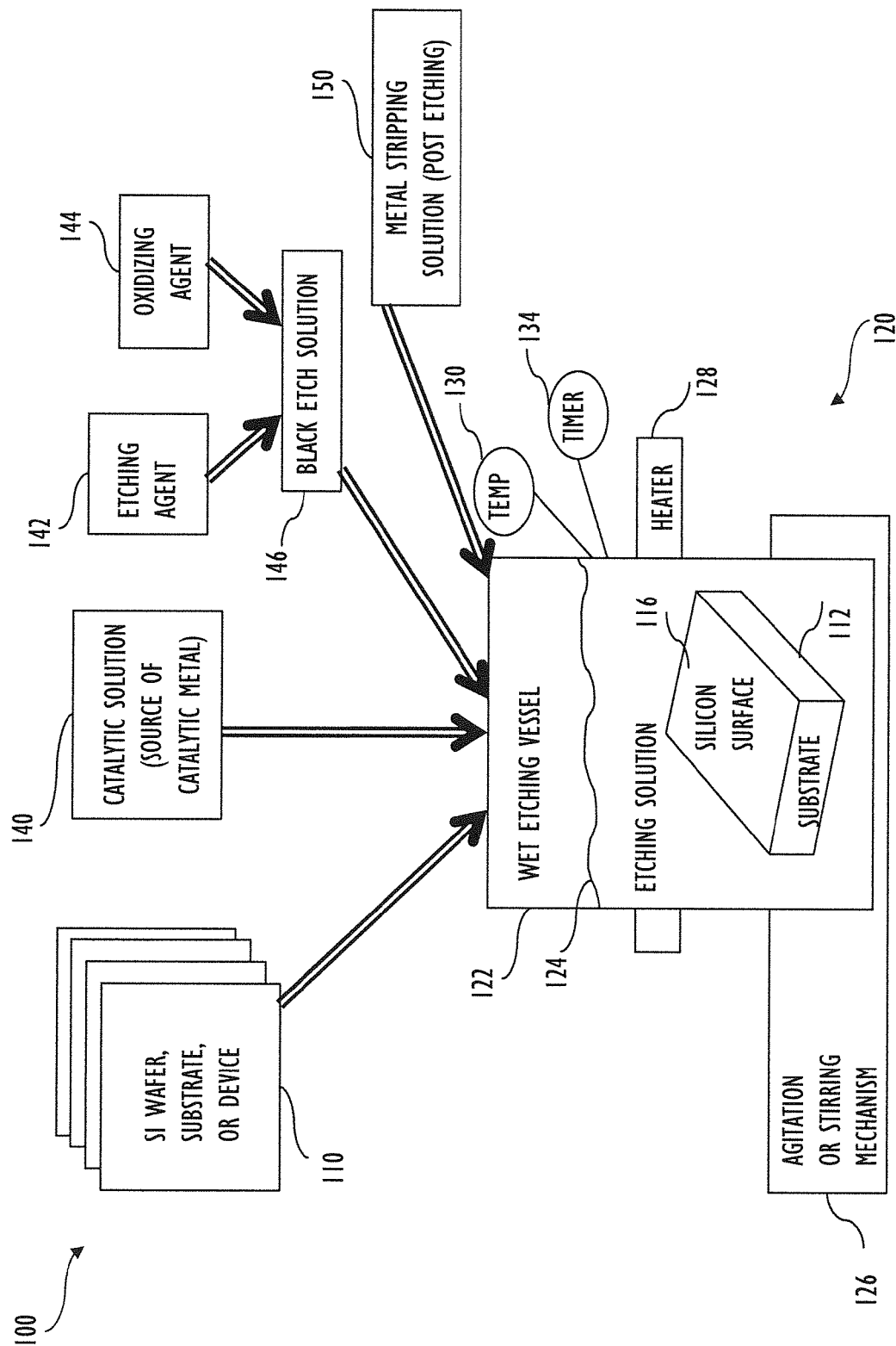

FIG. 6 illustrates in schematic and/or functional block form an exemplary etching system for use in texturing silicon surfaces to form a graded-density AR region or layer using catalytic solutions, with catalytic metal molecules or ionic species of catalytic material, and a oxidant-etchant solution.

Figure 7:
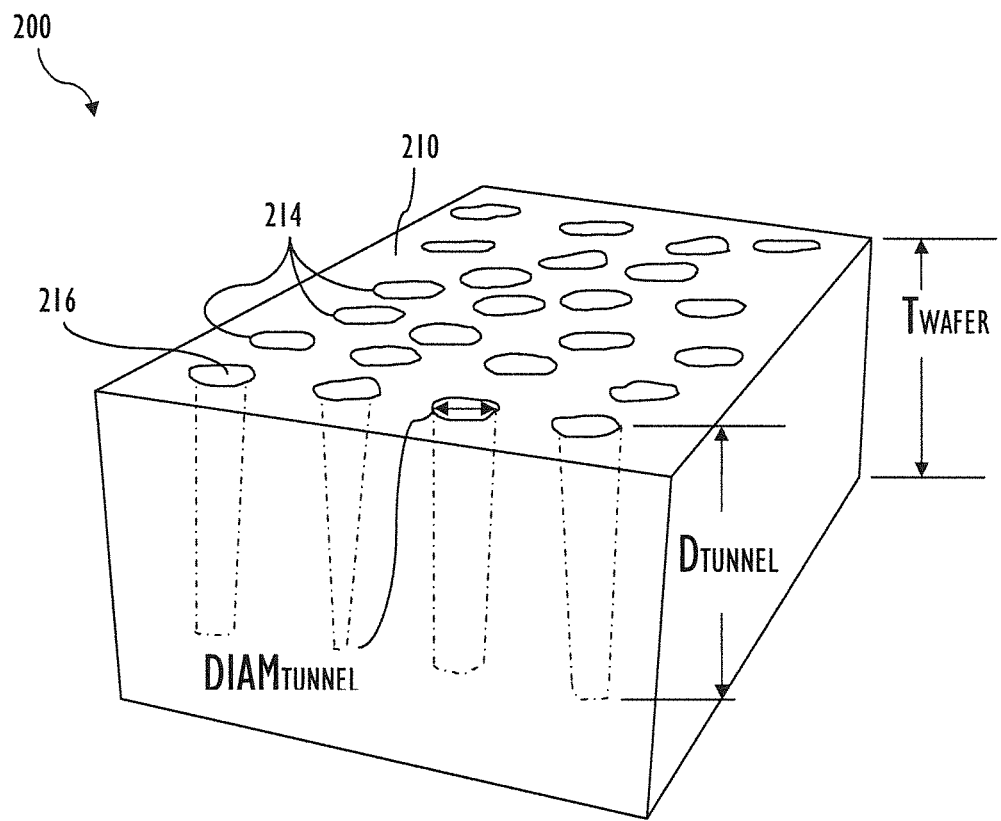

FIG. 7 illustrates simplistically an exemplary silicon wafer or substrate after etching with an etching solution including catalytic and oxidant-etchant solutions showing a textured silicon surface with a plurality of etched tunnels or pits.

Figure 8:
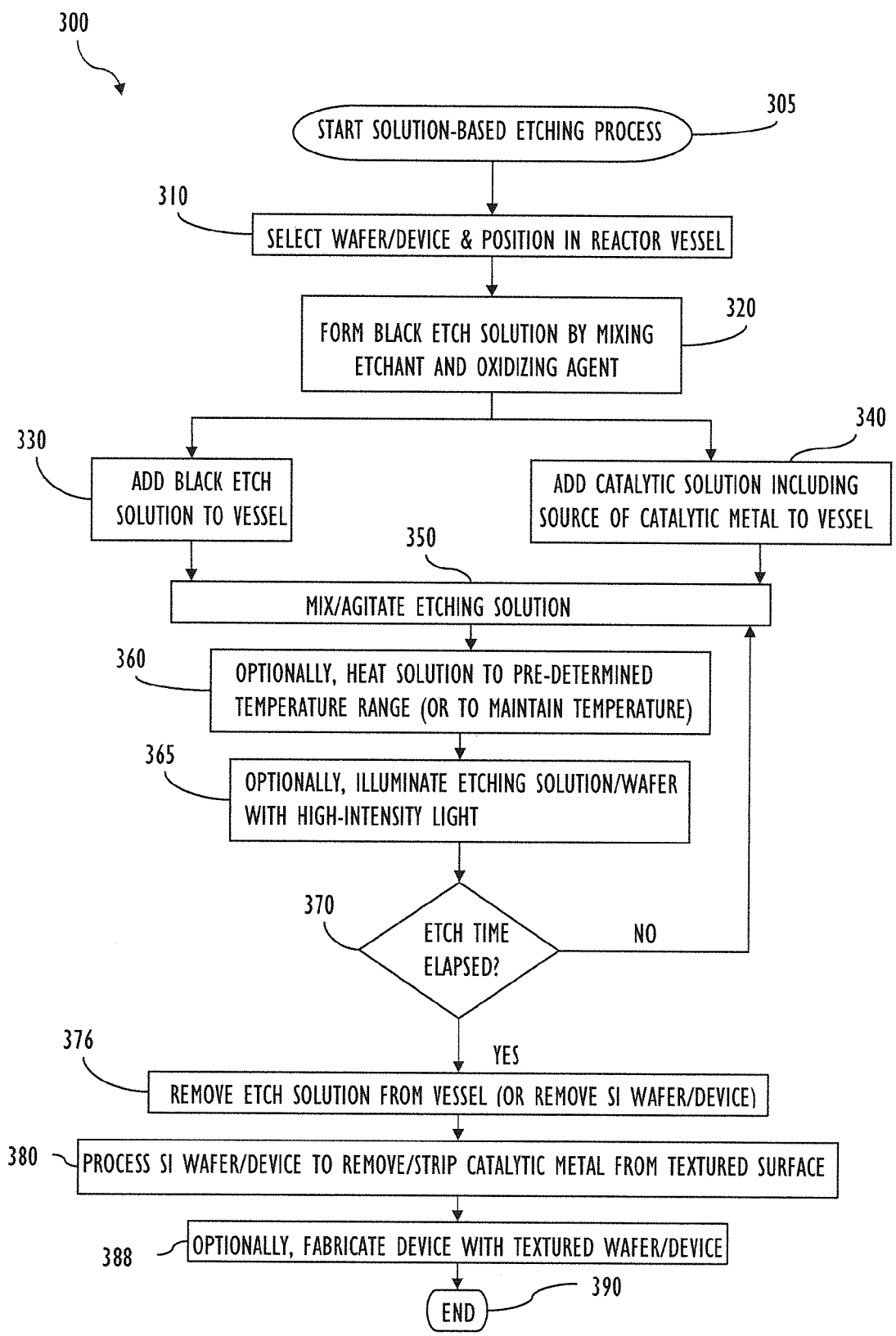

FIG. 8 is a flow chart of an exemplary texturing or etching process using catalytic solution combined with a oxidant-etchant solution to texture a silicon surface.

Figure 9:
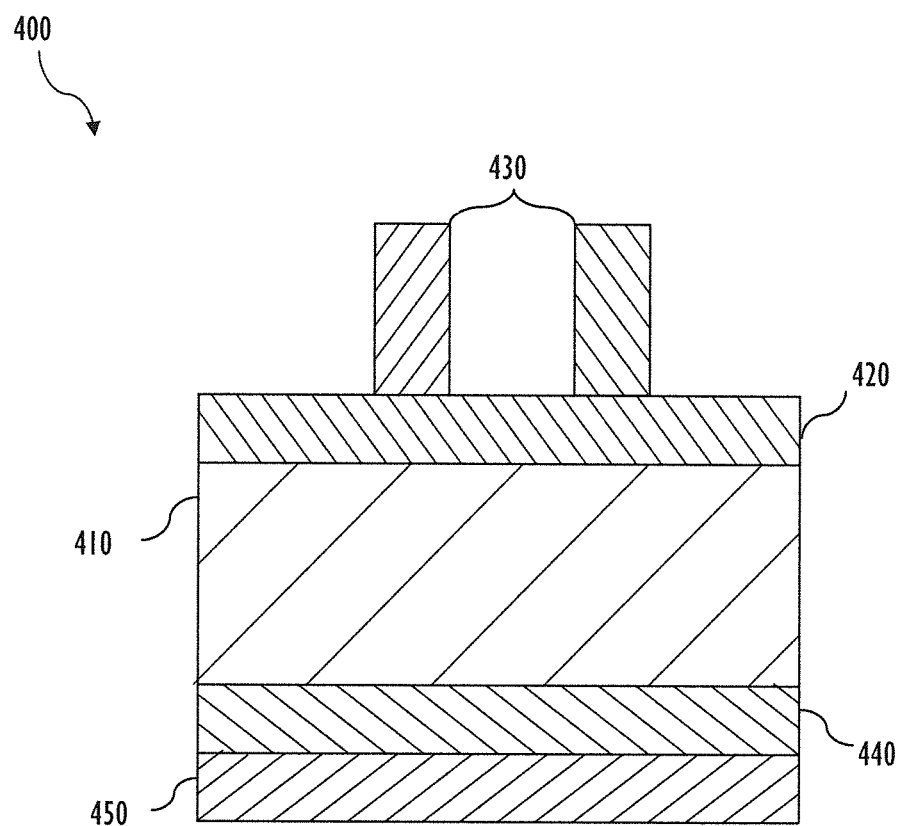

FIG. 9 is a sectional view of an exemplary solar cell fabricated with a silicon layer textured with catalytic metals such as with the system of FIG. 6 and/or the process of FIG. 8.

DESCRIPTION

The following provides a description of exemplary methods and systems for making high efficiency silicon (Si) solar cells and other devices using density-graded anti-reflection (AR) surfaces. As noted above, the use of black silicon or porous AR surfaces or regions on a silicon layer or wafer has proven effective in reducing reflective losses from the silicon surface (e.g., below about 2 percent across the useful solar spectrum and across a wide range of incident angles). However, despite this beneficial AR characteristic, Si solar cells with a graded-density or black silicon AR region or surface had only been able to achieve energy conversion efficiencies of about 14 percent (e.g., 13.9 percent in some tests). In contrast, testing has shown that implementation of the techniques described herein have improved efficiencies of Si solar cells with a graded-density layer or region (i.e., a black silicon or porous surface) to over 16 percent (e.g., 16.8 percent in some tests, which is 2.9 percent absolute higher than previous results). Particularly, the following description describes methods and systems for making high efficiency Si solar cells by showing how to effectively and efficiently passivate the black silicon to reduce energy conversion efficiency losses caused by the relatively large surface area of this AR region of the Si solar cell.

Figure 1:
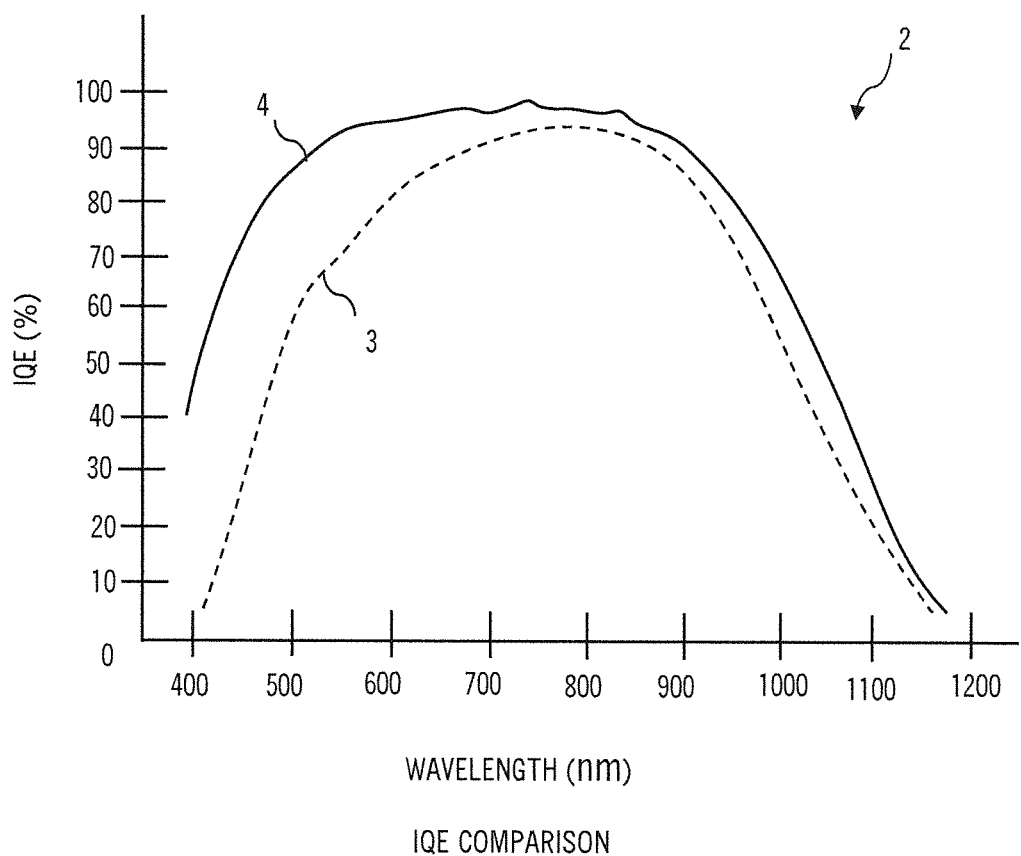
FIG. 1 is a graph illustrating improvements of internal quantum efficiency (IQE) achieved with the passivation of the black silicon or graded-density AR surface or region in a solar cell.

FIG. 1 illustrates a graph 2 providing a comparison of internal quantum efficiency (IQE) for a Si solar cell over the useful solar spectrum (i.e., a plot of IQE versus wavelength for a Si solar cell). In the graph 2, IQE values were plotted, as shown at 3, for a Si-solar cell with a graded-density AR region or surface (e.g., black silicon formed on the light-receiving surface of a silicon wafer). Then, the IQE values were plotted, as shown at 4, for the same Si-solar cell after the application of a passivation layer (e.g., the black silicon was oxidized to produce a layer or coating of $SiO_2$). As shown in the IQE comparison graph 2, a thin silicon dioxide layer provides effective surface passivation for a Si solar cell that has a graded-density AR region or layer (e.g., a Si solar cell using black silicon for its AR properties). The graph 2 shows significant improvement of IQE at short wavelengths (line 4 at 4) compared to an identical density-graded surface without such thin silicon dioxide passivation (line 3 at 3). Some estimates indicate an increase or improvement with such passivation of about 3 $mA/cm^2$ short-circuit current or about 10 percent of the total current.

Figure 2:
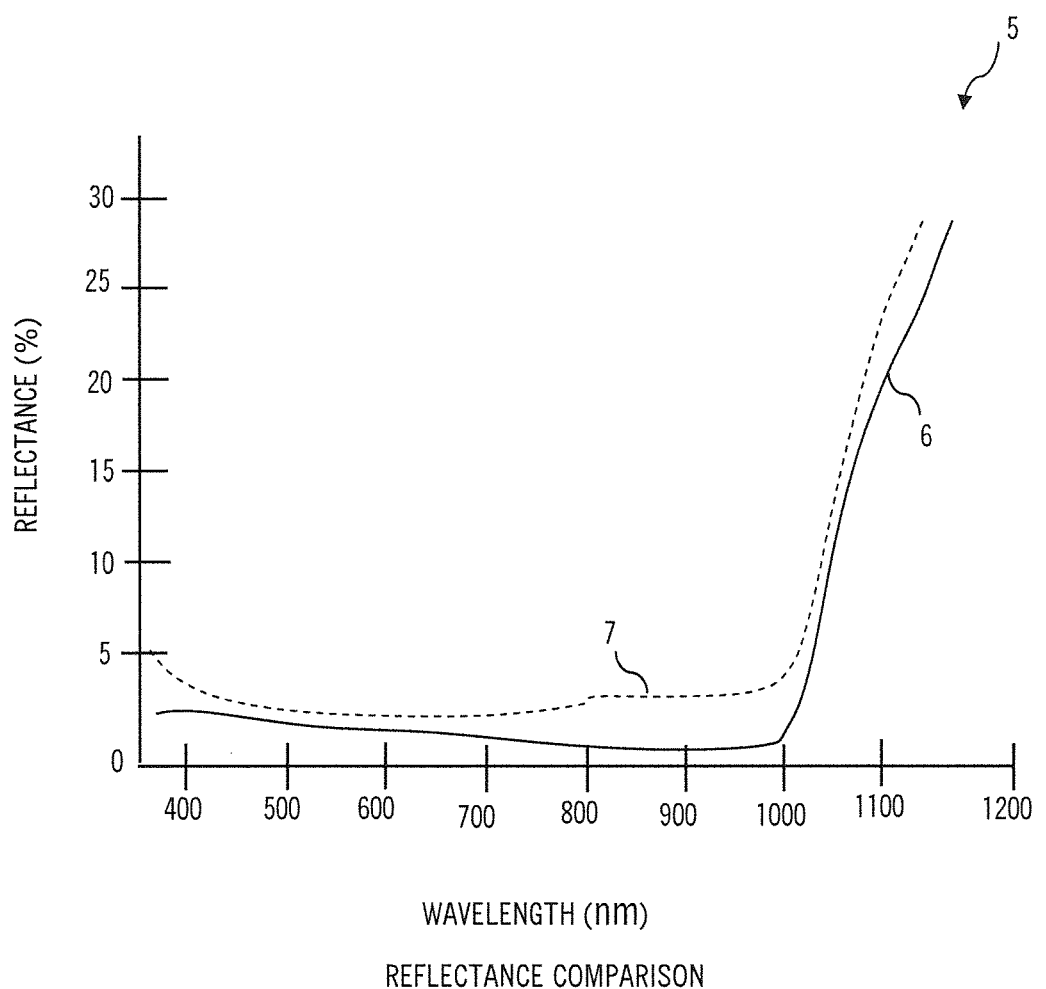
FIG. 2 is a graph illustrating differences in reflectance with for a Si solar cell before passivation and after passivation of the AR region/surface in one implementation of passivating technique described herein.

FIG. 2 illustrates a graph 5 providing a comparison of reflectance between the Si solar cell of FIG. 1 without passivation (shown with line 6 in graph 5) and with passivation with a silicon dioxide layer (shown with line 7 in graph 5). As can be seen from FIG. 2, the reflectance comparison of the two Si solar cells indicates that the thin silicon dioxide or passivation layer on the graded-density AR layer or surface does not significantly interfere with the excellent anti-reflection property of the density-graded surface. As shown with the test results graphed in FIG. 2, reflectance from about 350 to 1000 nm wavelength after the complete solar cell processing was on an energy-weighted average basis around 1.5 percent higher (shown with line 7) than the initial reflectance from the density-graded surface (shown with line 6). It is likely that a part of the 1.5 percent reflectance increase may be from other solar cell processing steps instead of from the formation of the silicon dioxide. Regardless, the overall reflectance shown with line 7 for the passivated Si solar cell that uses a black silicon region for anti-reflection is still better than typically achieved with a conventional Si solar cell processing (e.g., processing that may include micro-scale texturing an application of an AR coating).

Figure 3A:
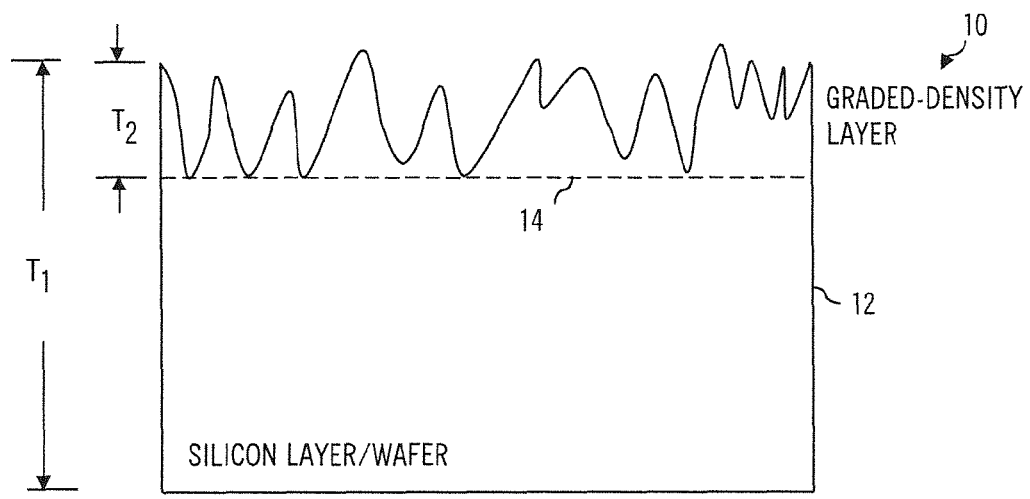
FIGS. 3A-3C illustrate an exemplary silicon-based device, such as a high efficiency silicon solar cell, during various stages for manufacture including after formation of a black silicon layer or region on one surface of the silicon layer or wafer, after doping of the silicon layer (e.g., emitter homo-junction formation or the like), and after passivation of the black silicon layer.
Figure 3B:
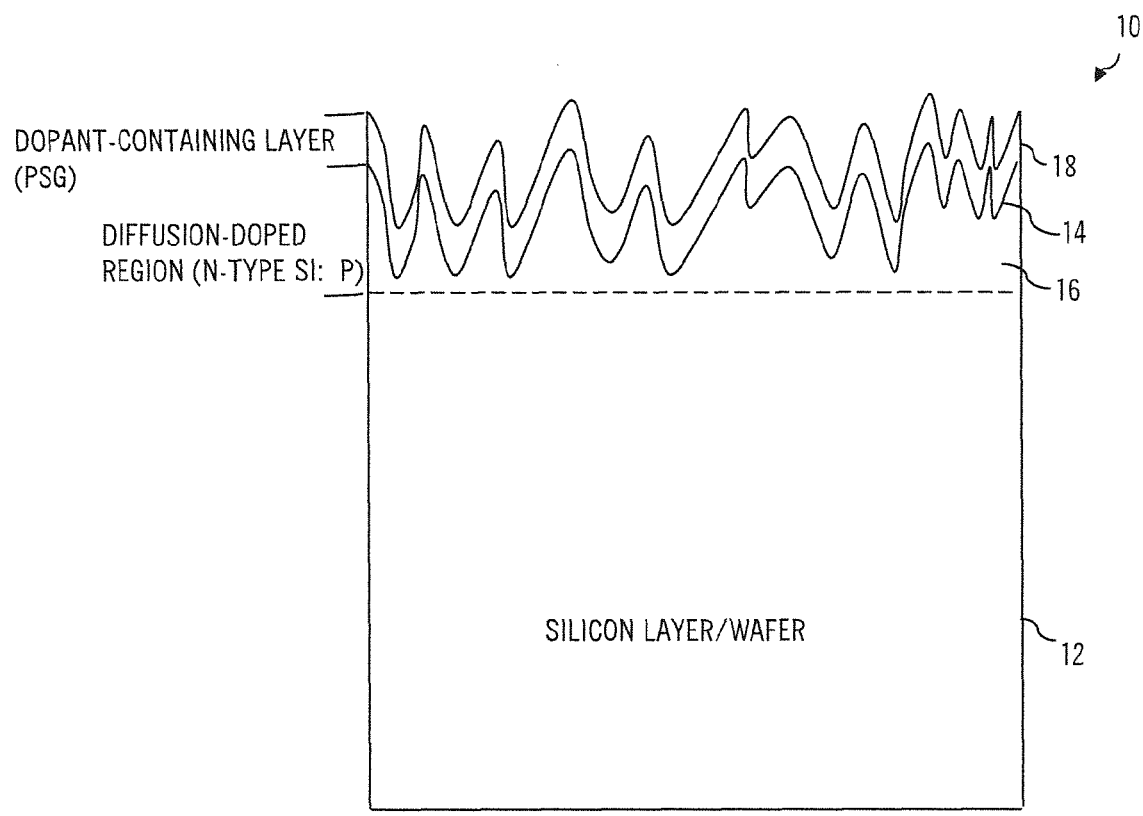

FIGS. 3A to 3B illustrate in simplified, schematic form a Si-based device 10 such as a solar cell or a detector during its manufacture such as to provide a high-efficiency Si solar cell. The Si-based device 10 includes a silicon layer or substrate 12 that provides a silicon surface for receiving light. For example, the layer 12 may be a Si wafer typically used to produce a solar cell, an optoelectronic device such as a detector, or other device/product. The silicon surface of the layer 12 may be mono-crystalline, multi-crystalline, amorphous, or the like. In FIG. 3A, the Si-based device 10 has been processed to form a graded-density AR region, surface, or layer 14 on the light-receiving surface of the silicon layer 12.

A number of techniques may be used to form this AR region 14 such as the techniques described herein to form black silicon with a large surface area provided by the varying porosity or density of the layer/region 14 (e.g., increasing density from the outer light-receiving surface to the base material of the silicon layer 12). The graded-density layer 14 may be relatively thin compared with overall thickness of the device 10 or even the silicon layer 12. For example, the overall thickness, $t_1$, of the device 10 shown in FIG. 3A may be up to 100 to 200 microns or more while the thickness, $t_2$, of the AR region 14 provided by the black silicon may be up to 0.3 to 2 microns or more, but the AR region 14 is still effective in significantly reducing reflectivity as shown in FIG. 2 with line 6.

In some embodiments, the Si surface or layer 12 has nanoscale roughening to provide the AR region 14 that significantly reduces reflectivity. Significantly, the use of catalytic solutions may be used to produce nanoparticles of gold, silver, or other metal that in situ or in the etching solution (such as 2 to 30 nm gold particles, 2 to 30 nm silver particles, or the like depending on the makeup of the catalytic solution) cause the surface 12 to have a plurality of pits or tunnels, to produce AR region 14, where etching has occurred much more rapidly due to the presence of a nanoparticle. A catalytic nanomaterial may be used that may include, for example, 2 to 30 nm Au nanoparticles, 2 to 30 nm Ag nanoparticles, and/or noble metal nanoparticles, which may be provided in a colloidal solution. In practice in some implementations, an oxidant-etchant solution is formed with an etching agent, such as HF, and an oxidizing agent (e.g., a silicon oxide or simply silicon oxidizing agent), which may be one of $H_2O_2$, $O_3$, $CO_2$, $K_2Cr_2O_7$, $CrO_3$, $KIO_3$, $KBrO_3$, $NaNO_3$, $HNO_3$, and $KMnO_4$.

To provide a useful Si-based device 10 such as a solar cell, the silicon layer 12 is typically doped such as with n or p-type doping of varying levels. For example, a doping step may be performed on the device 10 after the formation of the black silicon or AR region 14 such as to form an emitter homo-junction as shown at 16 in FIG. 3B. In practice, a dopant-containing precursor or source of dopants is provided in a high-temperature environment (e.g., 700 to 1150 or even 1250° C. or higher with a specific temperature range chosen for the particular dopant-containing precursor or dopant source). The result of this doping step is shown in FIG. 3B. The device 10 now includes a diffusion-doped region 16 in the silicon 10 that may, for example, act as the emitter homo-junction of a solar cell. Also, as part of this doping step, a dopant-containing layer 18 may be formed over the top of or on the graded-density AR layer or region 14. This may be a thin layer of glass formed during the high-temperature processing of the device to form the diffusion-doped region dopant-containing layer 16.

For example, the dopant-containing precursor may be liquid $POCl_3$ (phosphoryl chloride or phosphorous oxychloride) (or $BBr_3$ or other reservoir-type source) that becomes gaseous at high temperatures (e.g., a temperature of about 850° C. may be used to create the diffusion doped silicon region 16) and with or without a carrier gas is moved over or against the AR region or black silicon 14. After a period of time, the result is as shown in FIG. 9 with a dopant-containing layer 18 formed over the graded-density layer or AR region 14, e.g., a layer of phosphorus silicate glass (PSG). In this example, the diffusion-doped region or layer 16 may contain a desired amount of phosphorus (n-type Si), and, although shown separate for ease of illustration, this region or layer 16, of course, includes the silicon of the graded-density or porous AR layer or region 14.

Figure 3C:
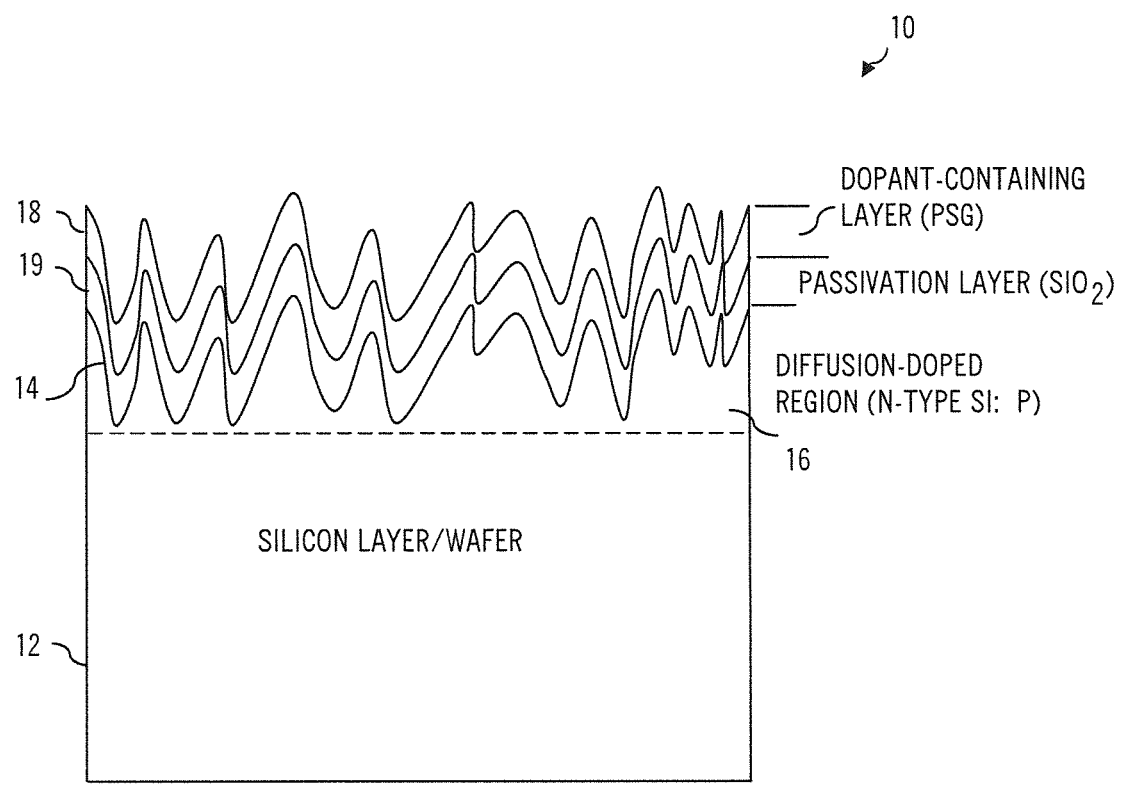

Prior conventional wisdom and industrial practices teach that the dopant-containing layer be stripped away from the device 10. However, it has been determined that a high-efficiency Si solar cell (or other device) may be created by retaining the dopant-containing layer (e.g., layer of PSG or the like) 18. Such a device 10 is shown in FIG. 3C after passivation of the graded-density layer or region 14 has been completed. As discussed above with reference to FIG. 1, surface passivation of the graded-density or AR region 14 is desirable to improve the IQE of a Si-based device such as a Si solar cell. The inventors determined that this can be achieved without first removing the dopant-containing layer 18 and even, in some cases, as part of a single raised or high temperature operation or step.

To this end, a passivation layer 19 is grown or created on the light receiving surfaces of the graded-density layer 14. In some cases, the creation of the passivation layer 19 (and surface passivation of the AR region 14) is performed after doping is performed to create diffusion doped silicon region 16 such that the dopant-containing layer 18 is at least partially covering the AR region 14. This may be performed in a number of ways, as discussed below, by providing a passivation source in or connected to the high temperature chamber containing the device 10. For example, the passivation source may be oxygen or water vapor that is caused to flow over the exposed surface of the dopant-containing layer (e.g., PSG) 18, and oxygen diffuses through the layer 18 to grow a thin layer 19 of silicon dioxide ($SiO_2$) (or other passivating silicon oxide ($SiO_x$, with x between 1 and 2)) on all or most of the light receiving surface of the graded-density layer 14. The thickness of the $SiO_2$ passivation layer may vary to practice a high-efficiency device 10, e.g., from about 5 to 50 nm thick with 15 to 30 nm being useful and one implementation providing a thickness of about 10 to 30 nm or more (with 20 nm being measured in some cases such as the device with test results shown in FIGS. 1 and 2).

While the passivation layer 19 may be formed after the doping step is performed to form the diffusion doped silicon region and dopant-containing layers 16 and 18, surface passivation of AR region 14 may also be performed prior to the doping step or fully/partially concurrently with such a doping step (e.g., feed $POCl_3$ and $O_2$ into the high temperature chamber with the device 10 of FIG. 3A concurrently or at least with some overlap). Note, in prior Si cell fabrication processes, the layer (PSG) 18 is stripped away. With device 10 shown in FIG. 3C, this is not only not required but is typically not desirable as such stripping likely will also remove or at least degrade the passivation layer 19 (e.g., remove much or all of the $SiO_2$ layer). Retaining the dopant-containing layer 18 is acceptable in the device 10, though, and the combination of the inclusion of the black silicon or AR region/layer 14 along with surface passivation layer 19 produces a high-efficiency Si device such as a Si solar cell with energy conversion efficiencies of over 14 percent (e.g., up to about 16.8 percent or higher).

FIG. 4 illustrates a Si device processing system 40 that may be used to both dope and passivate a silicon device that has a black silicon or graded-density AR surface/region to control reflectance. The system 40 is useful in part because it eliminates the need for a particular machine for applying an AR coating, e.g., eliminates need for machine/device for applying a layer of silicon nitride. However, such AR coatings also provided passivation, and the system 40 is configured to provide passivation of a graded-density AR region or region of black silicon on the Si substrate/wafer without additional machines and, in some cases, during a single raised temperature process (i.e., concurrently or after doping of the Si substrate). In other words, the system 40 integrates passivation of the graded-density AR surface/region and diffusion/doping of the Si substrate/wafer.

To this end, the system 40 is shown to include a high-temperature reaction chamber 42. A heater 43 is included that is operable to raise the temperature of the chamber 42 (or portions of its interior such as a wafer and gases flowing over such wafer) to a desired high temperature (or high temperature range). A thermometer or temperature sensor 45 is provided (or may be integrated with heater 43) to determine the chamber temperature to assist (as feedback or the like to the heater controller) the heater 43 in maintaining the chamber 42 within a desired temperature range. For example, the high temperature range for doping and surface passivation of a Si substrate 12 may be within the range of 700 to 1250° C. with one useful, but not limiting, high temperature being about 850° C. (with a range of 5 to 10° C. about this high temperature set point). A timer 44 may be provided in the system 40 to determine the length of particular processing steps such as to determine a length of a doping period and/or of a passivation period. Typically, each of these time periods may be in the range of 5 to 120 minutes when conventional heating is utilized (e.g., 5 to 20 minutes for doping followed by a 5 to 20 minute passivation period). In other cases, though, rapid thermal processing (RTP) may be used such that each or one of the time periods may be less than 5 minutes.

In practice, a device 10 as shown in FIG. 3A is positioned with the chamber 42, and the device includes a Si substrate or wafer 12 that has been processed so as to include a graded-density AR surface (or region of black silicon) 14 on its light receiving surface. The system 40 further includes a source of doping material as is shown with the source or input of a dopant-containing precursor 46. Also, the system 40 includes a passivation source 48 that is useful for injecting a gas or vapor that is useful for surface passivation of the AR surface 14. Generally, the temperature as measured by temperature sensor 45 is raised in the chamber 42 to above 700 C such as up to a range about 850° C.

At this point, the system 40 may be operated to inject or input dopant-containing material from the source 46. This results in the Si substrate 12 being doped such as to form an emitter homo-junction in device 10. The dopant-containing precursor 46 may be a solid source dopant such as a wafer of boron nitride that is placed in the chamber near the device 10. A liquid source dopant may be used instead for source 46 such as a precursor that is sprayed or, alternatively, spun upon the surface of AR region/layer 14 of device (e.g., a spin-on dopant film may be spun onto the AR surface 14 in a liquid form). The spinning may be performed before the Si wafer or substrate 12 is placed in the oven (or chamber 42).

In some cases, the source of dopant 46 is a reservoir of liquid $POCl_3$ that becomes a gas when heated and with or without a carrier gas is caused to flow within the chamber 42 over the AR surface 14 to dope the Si substrate 12, which results in an $n^+$-type Si[P] forming in the substrate 12 and a layer of phosphorus silicate glass (PSG) forming on the graded-density AR surface 14. In other cases, the dopant-containing precursor 46 may be a gas or vapor that is injected or pumped into the chamber 42 to react with substrate 12 so as to dope the silicon as desired to provide an efficient silicon device (such as an efficient Si solar cell). For example, such gaseous/vapor precursors may be $PH_3$ (phosphine), $B_2H_6$ (diborane), TMB (tetramethylbenzidine), or the like. In many of the processes or treatments described herein, the use of the dopant-containing precursor 46 to form the emitter homo-junction or otherwise dope the Si substrate/wafer 12 results in a dopant-containing layer to be formed over the graded-density AR surface 14. With each such precursor 46, the temperature of the chamber is kept elevated within an elevated temperature range (e.g., over 700° C. and, in some cases, 5 to 15° C. within 850° C. or the like) for a period of time (e.g., up to 5 minutes or more). However, in many cases, this layer is retained (i.e., not stripped away), and the next processing step is performed.

Specifically, with the chamber temperature maintained at the same (or a different) high temperature, the passivation source 48 is operated to inject or input a passivation gas or vapor into the chamber 42 so as to cause surface passivation of the graded-density AR surface 14. For example, the AR surface or region 14 may be black silicon and the passivation source may be gaseous oxygen or water vapor. The presence of such a passivation gas at the high temperature causes a passivation layer such as silicon dioxide ($SiO_2$) to grow on the surfaces of the graded-density AR region or layer 14 (e.g., the oxygen diffuses through the PSG layer to react with the large surface area of the black silicon). As with the doping step, the passivation step is typically performed for a period of time with the temperature kept within a desired high temperature range, e.g., up to 5 minutes or more at over 700° C. such as at the doping temperature (e.g., about 850° C.) or a different temperature that may be higher or lower to suit the passivation source or other criteria. Other than oxygen or water vapor a number of materials may be used in forming the surface passivation (as the passivation source 48) such as, but not limited to, $NH_3$, $N_2O$, aluminum-bearing precursor molecules, and the like (which may result in differing passivation layers other than $SiO_x$ such as $SiN_x$, $AlO_x$, or the like). Once the passivation of the AR surface 14 is complete, the device 10 may undergo further processing to form a useful product or device such as additional processing to form a high-efficiency solar cell (e.g., application of front and back contacts or the like).

FIG. 5A illustrates a process 50A fabricating a high-efficiency Si device such as a Si solar cell. The process 50 starts at 51 such as by selecting a dopant containing precursor and a passivation source as well as temperature ranges for performing doping and surface passivation. The process 50 continues at 52 with forming a graded-density AR region on a light receiving surface of a Si substrate or wafer. This may be achieved using the etching or texturing silicon surfaces processed described below or through another technique such as any useful process for providing a thickness of graded-density black silicon on a silicon substrate or wafer that is useful as an AR layer/region.

At step 54, the Si substrate/wafer with the formed AR region is positioned within a chamber and the interior of the chamber is heated. At step 56, it is determined whether a preset minimum raised temperature or low end of a high temperature range has been achieved, and, if not, the heating at 54 is continued. Once the chamber is raised to within the high temperature range, the process may continue at 58 with performing doping of the Si substrate such as by injecting dopant-containing gas into the chamber while maintaining temperatures in the doping temperature range. For example, the dopant-containing gas may be POCl$_3$ and the raised temperature may be about 850° C. At step 60 of process 50, it is determined whether the doping time has elapsed (such as a time in the range of about 5 to 120 minutes or the like). If not, the doping is continued such as until adequate doping of silicon with phosphorus or another dopant is achieved to provide an emitter homo-junction in the Si device. Note, during the steps 58 and 60, a dopant-containing layer is also typically formed over the graded-density AR region such as a layer of PSG when the dopant-containing gas is POCl$_3$, and the method 50 does not include a step to remove the PSG as this layer is retained in the Si device (at least in many cases).

The process 50 continues at 62 with performing surface passivation of exposed surfaces of the graded-density AR region. Step 62 is performed at a high temperature, too, and the passivation temperature may be the same range as used for doping or a different range that is lower or higher. Surface passivation 62 may be performed with the dopant-containing layer in place (PSG layer covering the AR surfaces) and may involve, for example, injecting oxygen or water vapor such that oxygen diffuses through the PSG or other dopant-containing layer to form a passivation layer (e.g., a thin layer of SiO$_2$). At 64, the method 60 continues with determining whether a preset passivation time has elapsed, and, if such a time period has not passed (e.g., 5 to 120 minutes or the like with many applications taking between 5 and 20 minutes using conventional heating techniques), the method continues exposing the substrate to a passivation source such as oxygen. Once the passivation time has elapsed, the method 50 may continue at 66 with optional additional fabrication steps to form a high-efficiency device with a passivated Si substrate, e.g., apply front and back contacts to form a Si solar cell or the like. The method 50 then may end at 68 such as with removal of the wafer from the chamber (or this may be done prior to step 66).

The system 40 and method 50 are described as providing processing of a Si substrate/wafer to first perform doping (e.g., formation of an emitter homo-junction) followed by performing surface passivation of the black silicon or graded-density AR region. This is useful as it integrates passivation with a doping or diffusion step into a single high temperature step/process (e.g., the temperature of the chamber only has to be raised once and then doping and passivation may occur sequentially over a period of time while retaining the high temperature rather than requiring a cooling down period). The use of a one raised temperature step is desirable as it saves energy, saves processing time, avoids structural damage to the Si device that may occur by repeated heating and cooling, reduces risks of introducing material contamination, and limits other disadvantages associated with use of multiple high temperature process steps.

However, the method 50A may be modified in some cases to provide a high-efficiency Si device. For example, the passivation and doping steps may be performed fully or at least partially concurrently such as beginning doping and then without evacuating the chamber of the dopant-containing gas or precursor initiating passivation. In other cases, the passivation (or steps 62 and 64) may be performed first and, once completed, performing the doping (or steps 58 and 60 after steps 62 and 64).

In still other cases, it may be desirable to perform two high temperature steps. For example, it may be desirable to allow the substrate to cool after performing the doping step. In such cases, the heating steps 54 and 56 may be repeated prior to performing surface passivation (steps 62 and 64). Additionally, in such cases, it may be useful to strip the dopant-containing layer from the graded-density AR region prior to performing surface passivation (e.g., perform dopant oxide (P$_2$O$_5$) stripping when dopant-containing material is POCl$_3$). Such a stripping away requires an additional step but may lead to improved reflectance characteristics in the Si device. This process then provides a doped silicon substrate with a graded-density AR surface that it effectively passivated (e.g., the irregular and large surface of the black silicon has undergone surface passivation).

In still other cases, the method 50A may be modified to utilize spin-on dopants (SODs) as the source of dopants. FIG. 5B illustrates a process 50B that utilizes many of the steps of process 50A of FIG. 5A with some modifications and with an added step 53. In step 53, a dopant-containing layer or SOD is applied on the silicon surface after step 52 but before putting the silicon substrate or wafer into the high-temperature reaction chamber 42. The high temperature process steps 54-64 are repeated but with step 58 being performed instead to drive in the dopant from the SOD into the silicon surface of the wafer or substrate. In this manner, SODs may provide a useful category of dopant-containing precursors for use in forming high-efficiency silicon-based devices as taught by this description.

As will be appreciated, the passivation techniques described herein for black silicon-based Ar layers/regions provide significant improvements over prior Si device processing. For example, typical crystalline Si solar cell includes micro-scale surface texturing and then emitter homo-junction formation, which was always followed by dopant oxide stripping to remove the PSG or the dopant-containing layer from the Si solar cell. Then, the processing includes front surface passivation layer deposition with this layer also providing an anti-reflective coating (e.g., a layer silicon nitride acts as an ARC and provides passivation of the etched silicon), and the solar cell processing typically also includes back contact formation (which may be combined with back surface field formation) and further includes front contact formation.

Density-graded front surfaces provide excellent anti-reflection, and there are potential cost benefits associated with such AR regions as well because use of black silicon and the like for anti-reflection eliminates the need of micro-scale surface texturing and any anti-reflection coating tools/steps. However, the density-graded surfaces create enormous surface area that is challenging to passivate, and it becomes one of the major performance-limiting factors for the Si solar cell that uses a graded-density AR surface or region such as provided by black silicon. Another complication is that the passivation layer added on top of density-graded surfaces should be chosen and configured such that the passivation layer does not interfere with the density/porosity gradient that black silicon and other density-gradient AR surface are designed to provide in a Si solar cell. With these challenges and restrictions in mind, the passivation techniques described herein create a thin passivation layer (e.g., a thin silicon dioxide layer) to passivate the Si density-graded surfaces. In some applications, the solar cell processing sequence is modified to the following steps: (a) density-graded surface formation; (b) emitter homo-junction formation; (c) optional stripping of the dopant-containing layer such as PSG removal; (d) passivation layer formation (e.g., silicon dioxide growth); (e) back contact formation (often combined with back surface field formation); and (f) front contact formation.

In other applications, though, reduced costs and other advantages are achieved by combining passivation layer growth with other high-temperature processing steps. For example, a silicon dioxide or other passivation layer may be grown afterwards (or at least partially concurrently with) steps such as emitter homo-junction formation (e.g., doping with $POCl_3$ or the like), back contact formation, or other processing steps that may require a higher temperature (such as a temperature over 700° C.). To implement such as method (such as with the system 40 shown in FIG. 4), an extra oxygen gas or water vapor inlet and source (or other passivation material source) may be added onto an existing apparatus configured to perform emitter homo-junction formation (e.g., high-temperature doping of silicon devices). The oxygen and/or water vapor inlet/source may be selectively operated to initiate passivation by growing silicon dioxide in-situ during one of the other high-temperature processing steps (such after or during doping). In one example, oxygen or water vapor is admitted into the processing or reaction chamber during back contact formation while the chamber is maintained at an appropriately high temperature (such as about 850° C.) and at an appropriate flow rate such that a single step or anneal provides an adequate thickness of passivation material (e.g., a thin oxide layer). In other cases, silicon dioxide is formed as the passivation layer together with the emitter (e.g., as part of same high temperature operation of the chamber with the passivation and dopant material sources operated sequentially or partially concurrently). In this case, for example, oxidation of the graded-density AR surface is added (or performed) after, during, or before application of the emitter diffusion so that the passivation and dopant-containing structure or layers form on the Si density-graded surface (e.g., a $SiO_2/P_2O_5$ or $SiO_2/PSG$ structure forms on the black silicon), with the silicon dioxide providing desired surface passivation for the Si solar cell.

At this point, it may be useful to describe at least one technique or process and related processing system for forming a graded-density AR surface or region such as a black silicon at a desired depth in a light receiving surface of a silicon substrate or wafer as shown with AR layer/region/surface 14 in FIG. 1. One such method is described below with reference to FIGS. 6-9.

For example, an anti-reflection etching may be used for silicon surfaces that are catalyzed with ionic metal solutions. Such an etching method provides a solution-based approach to etching silicon that may use inexpensive chemicals (e.g., a reaction based on catalytic quantities of ionic or molecular-compound or nanoparticle forms of gold, platinum, silver, or other catalytic metals in an oxidant-etchant solution is very inexpensive to create). The etching method is "one-step" rather than multi-step in the sense that etching occurs in the presence of the oxidant-etchant solution and the nanoparticle or metal ionic or molecular solution as these experience ultrasonic or other agitation. The etching method is advantageous in part because of its simplicity and speed, with etch times being relatively short and not requiring deposition/coating pre-etching. The etching method is also desirable as it produces textured silicon surfaces with low reflectivity over a broad spectrum, and these non-reflective layers or textured silicon surfaces have a wide acceptance angle of anti-reflection. Further, the etching method(s) is applicable to nearly all surfaces of silicon including multi-crystalline silicon. As will be seen, the resulting silicon surfaces are likely to be highly desirable in the photovoltaic or solar cell industry. For example, the etching method, with $HAuCl_4$ provided as or as part of the catalytic solution, has been used to provide on (100) crystal silicon wafers reflectivity ranging from about 0.3% at a wavelength of 400 nm to about 2.5% at a wavelength of 1000 nm, with most of the usable solar spectrum below 1% reflectivity. When the catalytic solution included AgF, the etching solution technique was able to obtain reflection of less than about 5% on 100 crystal silicon wafers.

As will become clear, numerous catalytic solutions or sources of catalytic metals may be used to practice the etching process. One embodiment uses a catalytic solution chosen to provide nanoparticle or molecular or ionic species of gold (e.g., chorauric acid ($HAuCl_4$) in aqueous solution) while another exemplary embodiment uses a catalytic solution (e.g., a solution with AgF) to provide nanoparticle or molecular or ionic species of silver. Generally, the molecular or ionic species or a catalytic solution containing such catalysts is mixed with an etchant such as HF or the like and also with an oxidizing agent such as $H_2O_2$ or the like. In other embodiments, the catalytic solution may be chosen to provide nanoparticle and/or molecules and/or ionic species of other metals such as transition and/or noble metals in the etching solution such as platinum or the like, and this may be useful in further reducing the cost of etching and may be desirable as some of these metals may be less deleterious impurities in silicon than gold.

Generally, the silicon surface is a polished or smooth saw damage removal etched surface, but in some cases, the etching techniques may be performed in combination with other anti-reflection techniques. For example, the silicon surface may be an anisotropically pyramid-textured Si (111) surface (or other textured Si surface) that is then treated with a one step etching process by placing the Si (111) surface (or a substrate/wafer/device with the Si surface/layer) in an etching solution including a catalytic solution (with a metal-containing molecule or an ionic species of a catalytic metal), an etching agent, and an oxidizing agent. Used independently or with other surfacing processes, the etching solution is stirred or agitated for a period of time (e.g., a predetermined etch time) such as with ultrasonic agitation or sonication.

The following description stresses the use of catalytic solutions in etching silicon surfaces for use in controlling (i.e., reducing or minimizing) reflectance, but the etching techniques described herein may be used for texturing silicon for nearly any application in which it is desirable to provide a silicon surface with a particular surface roughness or non-smooth topology such as optoelectronic devices, biomedical device, and the like. The description begins with a general overview of the etching process with reference to FIGS. 6-8. Then with reference to FIG. 9, the description provides an example of one device, i.e., a solar cell, which can be formed with a silicon substrate or wafer with an antireflective surface or graded-density AR region/layer/surface created by the explained texturing methods and passivated as discussed above. Next, the description provides a discussion of exemplary recipes (e.g., proportions of and particular types of catalytic solutions and the catalytic metals these solutions may provide, etching agents, oxidizing agents, silicon surfaces, agitation methods, etching times, and the like), processes, and the like to achieve useful results particularly with an eye toward reducing or nearly eliminating reflectance to increase efficiency of a solar cell (e.g., increase photon absorption in photovoltaic devices of silicon with a black silicon region or light receiving surface).

FIG. 6 illustrates a texturing or etching system 100 of one embodiment. The system 100 includes a source of or quantity of wafers, substrates, or devices 110 with silicon surfaces. These may be Si wafers that are to be used in solar cells, optoelectronics, or other products. The silicon surface 116 on silicon sample 112 may be mono-crystalline, multi-crystalline, amorphous, or the like, and the type of doping may be varied such as to be n or p-type doping of varying levels (such as from about 0.25 ohm-cm to about 50 ohm-cm or the like). The wafer, substrate, or device 110 may have one silicon surface or two or more such surfaces that will be etched during operation of system 100. The system 100 does not require a metal deposition station, but, instead, the system 100 includes an etching assembly 120 with a wet etching vessel or container 122. During operation, one or more of the Si wafers 110 or Si layers on substrate 112 are placed into the vessel 122 before or after adding a volume of an etching solution 124. In FIG. 6, a single substrate 112 is shown in the vessel with an exposed silicon surface 116 but, of course, a plurality of such surfaces 116 may be etched concurrently.

The assembly 120 includes a mechanism 126 for agitating or stirring the solution 124 initially and/or during etching. The mechanism 126 may be a mechanical or magnetic-based stirring device while in some cased enhanced or more repeatable results are achieved with an ultrasonic agitator for stirring/agitating reactants or solutions such as etching solution 124 by sonication. The assembly 120 may include a heater 128 to maintain or raise the temperature of the etching solution 124 within one or more desired temperature ranges to facilitate etching of surface 116. A temperature gauge or thermometer 130 may be provided to monitor the temperature of the solution (and, optionally, provide control feedback signals to heater 128), and a timer 134 may be provided to provide a visual and/or audio indicator to an operator of the assembly 120 regarding an etching or stripping step.

The system 100 further includes a catalytic solution 140 that provides a supply or source of a catalytic metal such as a metal containing molecule or ionic species of a catalytic metal. This source provides a quantity of catalyst for the etching solution 124 such as a quantity of a transition or noble metal such as gold, silver, platinum, palladium, copper, nickel, cobalt, and the like. Good results are typically achieved with solutions containing $HAuCl_4$, AgF, and similar acids or materials that release nanoparticle metals, metal-containing molecules or ionic species of such metals when mixed with the oxidant-etchant solution in the etching solution 124 in vessel 122. Generally, this catalytic solution with a metal catalyst is added to the vessel 122 to make up a portion of the etching solution 124, but, in other cases, the solution (or other source of metal-containing molecules or an ionic species of a catalytic metal) 140 is first added to the oxidant-etchant solution 146 (or to one of its components 142, 144) prior to insertion into the vessel 122 with the Si substrate 112. Specific, catalytic solutions and their makeup are discussed in further detail below.

To achieve etching of the silicon surface 116 (to form a graded-density AR surface or region), the system 100 includes a source of an etching agent 142 and of an oxidizing agent 144. These are chosen specifically for texturing/etching of silicon, and the etching agent 142 may be HF, $NH_4F$, or a similar etchant. The oxidizing agent may be $H_2O_2$ or another agent such as one that has its decomposition catalyzed by the metal provided by catalytic solution 140. For example, the oxidizing agent 144 may include $H_2O_2$, $O_3$, $CO_2$, $K_2Cr_2O_7$, $CrO_3$, $KIO_3$, $KBrO_3$, $NaNO_3$, $HNO_3$, $KMnO_4$, or the like or a mixture thereof. These agents (or solutions thereof) 142, 144 may be added separately to the vessel 122 to form the etching solution 124 along with the catalytic solution 140 or, as shown, a oxidant-etchant solution 146 may be formed first by combining the etching agent 142 and the oxidizing agent 146 and then putting this solution in the vessel 122. The assembly 120 is then operated such as by agitation via mechanism 126 and heating by heater 128 for a time period ("etch time") to texture the surface 116. After the etch time elapses, the solution 124 is removed (or substrate 112 is moved to another container or vessel for metal stripping), and remaining metal catalyst is removed as it is likely to present an undesirable impurity in silicon. To this end, the system 100 includes a source of a metal stripping solution 150 that is added to the vessel 122, and the stripping solution may be stirred or agitated (and, optionally, heated with heater 128) by mechanism 126 until all or substantially all of the metal from material 140 is removed from surface 116. The substrate or wafer 112 may then be used as-is (e.g., as Si device 10 shown in FIG. 3A with a graded-density layer 14) or as a component or layer of a larger device such as a solar cell or photovoltaic device, an optoelectric device, a biomedical device, or the like (as shown at 400 in FIG. 9).

FIG. 7 illustrates simplistically a silicon wafer 200 after treatment of an etching process as described with operation of system 100 of FIG. 6 and described below with reference to FIG. 8. As shown, the wafer 200 includes an upper surface or Si surface 210 (e.g., a graded-density AR surface or black silicon region) that has been exposed to an etching solution for a period of time or an etch time. The Si surface 210 has nanoscale roughening that significantly reduces reflectivity. Significantly, the use of catalytic solutions as described herein is believed to act to produce nanoparticles of gold, silver, or other metal that in situ or in the etching solution (such as 2 to 30 nm gold particles, 2 to 30 nm silver particles, or the like depending on the makeup of the catalytic solution) cause the surface 210 to have a plurality of pits or tunnels 214 where etching has occurred much more rapidly due to the presence of a nanoparticle (not shown in FIG. 7). Other mechanisms may be fully or partially responsible for the etching results achieved with the use of the catalytic solutions in combination with the oxidant-etchant solution. Note, many achieved porous morphologies will, of course, not have the simplistic surface shown in FIG. 7 especially when multi-crystalline silicon is etched (e.g., there are many black morphologies including, but not limited, to simple tunnels that may be used to practice the black silicon ARC regions/layers described herein).

Regardless of the acting mechanism(s), each tunnel 214 includes an opening 216 at the surface 210 with a diameter, $Diam_{Tunnel}$, and a depth, $D_{Tunnel}$, that is typically less (e.g., up to about 99.91% less) than the thickness, $t_{wafer}$, of the wafer 200, about 300 micrometers. For example, the tunnel diameters, $Diam_{Tunnel}$, may be somewhat larger than the particle size such as about 21 to about 23 nm when 5 to 10 nm nanoparticles are present in the etching solution. The tunnel depths, $D_{Tunnel}$, may be selected to provide a desired physical characteristic (e.g., an interference with reflection) and in the case of controlling reflectance by the silicon later 210 be between about 50 and about 300 nm (e.g., with one test showing tunnels in the 250 to 280 nm depth range) with a desired depth being selectable or controlled by controlling time and temperature for a particular etching solution. As can be seen from FIG. 7, the etching processes involving catalytic solutions that provide a source of catalytic metal (and, in some cases, nanoparticles of such metals) are effective in providing a nanoscale roughness or structure with tapered density that is desirable for reducing reflectivity (e.g., for forming a black silicon region on a Si substrate or wafer that can later be doped to form an emitter homo-junction and be processed as described herein to provide surface passivation of surface 210 including interior surfaces of tunnels 214).

FIG. 8 illustrates one embodiment of a solutions-based etching or texturing process 300 for processing a silicon surface to obtain a desired characteristic such as, but not limited to, a tapered surface that reduces reflectance or creates a black silicon surface (e.g., a graded-density AR region on the Si substrate/wafer). The process 300 begins at 305 such as with planning or selecting the type of silicon surface to be textured, e.g., a silicon wafer or a substrate or device with a silicon layer and a silicon surface, a particular crystalline surface or makeup, and a particular type of doping. Step 305 may also include choosing a recipe or step-by-step design for the texturing or etching of the silicon surface, and this may include choosing a catalytic metal and sources of molecules or ionic species of such as a metal, an etching agent for the silicon surface (e.g., HF or the like) and an oxidizing agent (e.g., $H_2O_2$, $O_3$, $CO_2$, $K_2Cr_2O_7$, or the like), the ratio of each of these to provide in the oxidant-etchant solution that includes these two ingredients, the type and amount of agitation/stirring, the desired depth of surface penetration to provide with the etching, and the time and temperature for etching (which, of course, will vary based on the prior decisions/parameters).

The texturing/etching method 300 continues at 310 with the wafer(s) (or substrates/devices) with the silicon surface being chosen and then positioned into a reaction or etching vessel. At 320, an oxidant-etchant solution is formed by combining or mixing the chosen etching and oxidizing agents (or solutions thereof), but, in some embodiments, this step is not performed and these two agents are simply added to the vessel concurrently or nearly so. The method 300 continues with the performance of steps 330 and 340, which may be performed concurrently or nearly so such as within a preset time period (e.g., less than about 5 minutes or more typically less than about 2 minutes between performance of each step) with either being performed first. At 330, the oxidant-etchant solution is added or input into the vessel with the silicon surface, and at 340, a catalytic solution is added to the vessel (such as an acid or an aqueous solution of an acid that acts as a source of metal nanoparticles or of molecules containing (or ionic species of) gold, silver, platinum, palladium, copper, cobalt, nickel, another noble or transition metal, or another catalytic metal/material). In some cases, the particles are provided "dry" or in similar form while in other cases metal-containing molecules (or materials that provide such molecules or ionic species in the presence of the oxidant-etchant solution) are contained in deionized water or aqueous solution and a volume of such solution is added to the vessel at 340. In other cases, nanoparticles were added with HF and $H_2O_2$ to provide a useful recipe.

At 350, the method 300 includes mixing or agitating the etching solution in the vessel such as with mechanical mixing devices or, more typically, with ultrasonic mixing technologies or sonication. At 360, the method 300 may optionally include heating the solution in the vessel to a predetermined temperature range (or adding heat to maintain the initial temperatures of the oxidant-etchant solution in a desired temperature range) chosen to hasten etching processes. At 365, the method 300 may include illuminating the etching solution and/or the wafer or silicon surface with light to facilitate or drive the etching reactions/processes. For example, particular silicon surfaces, such as deeply n-doped surfaces, may benefit from being illuminated under a high-intensity light, which may reduce the etching time (such as to 8 minutes or less in some cases and enhance reflectivity results such as to less than about 5% reflectance where 20 to 30% was achieved without providing intense lighting). At 370, the method 300 involves determining whether a preset etch time has elapsed (e.g., a time determined previously through testing to provide a desired depth or amount of etching based on the silicon surface type, the catalytic metal, and the oxidant-etchant solution composition). If not, the method 300 continues at 350.

If the etch time has elapsed, at 370, the method 300 includes removing the etch solution from the vessel or removing the Si wafer(s) from the vessel at 376. At 380, the catalytic metal is removed from the now textured silicon surface such as with use of a stripping solution selected based on the composition of the catalytic solution (e.g., a differing stripping solution may be used for gold, for silver, for platinum, and the like). At 388, the method 300 may include further processing of the textured wafer to fabricate a device that makes use of the textured/etched silicon surface such as a solar cell, a biomedical device, an optoelectrical device, a consumer electronic device, or the like, and the step 388 may be performed after or include performing the processing 50 shown in FIG. 5 to provide surface passivation and to form an emitter homo-junction. At 390, the method 300 is ended (or repeated by returning to step 305 where the same method may be repeated or changed such as to use one of the differing "recipes" described herein).

As discussed above, one reason it may be desirable to etch a silicon surface according to the processes described herein is to form a silicon substrate for use in forming a silicon-based solar cell with little or no total reflectance (e.g., without the need for application of an ARC or further processing). It will be understood that nearly any type of solar cell design may make use of the etching processes, and the description is intended to be broad enough to cover a wide variety of solar cells with varying design. However, at this time, it may be useful to at least describe one useful solar cell arrangement and to follow this with a brief discussion of one useful fabrication technique, and these descriptions may then be used to fabricate solar cells and other devices with silicon surfaces textured as described herein.

FIG. 9 illustrates a relatively simple solar cell 400. As shown, the exemplary solar cell 400 includes a silicon substrate 410 with at least an upper surface that has been textured or roughened with a catalytic nanomaterial-based etching process (such as using the system 100 of FIG. 6 or the method 300 of FIG. 8) and then further processed to include surface passivation (e.g., to provide a silicon oxide or other passivation layer) of this black silicon surface/region as described herein. The reflectance of substrate may be controlled to be under about 20 percent, more typically less than about 10 percent, and in many cases in the range of about 0.3 to 2.5 percent or up to about 5 percent or more by such techniques.

The substrate 410 may be, for example, a Boron-doped, p-type silicon surface or nearly any other silicon surface useful in solar cells. In such a case, the cell 400 may further include an n-type emitter layer 420, that is formed as discussed at least as step 58 of processing 50 in FIG. 5, which may be provided on/in/below the textured or upper surface of the silicon substrate 410. Further, the AR surface of substrate 410 may be passivated with a thin passivation layer (e.g., SiOx or the like) that may be provided as layer 420 (and layer 420 may further include an outer layer of dopant-containing layer such as a thin layer of PSG or the like).

A plurality of electrical contacts (e.g., silver or other contact material) 430 may be positioned on the emitter layer/passivation/dopant-containing layer 420, and the cell 400 may further include additional layers/components to provide a desired functionality such as a back surface field layer 440 (e.g., an aluminum or similar metal layer) and a contact layer 450 (e.g., an aluminum or similar material layer). The silicon substrate 410 with an etched surface may take many forms such as an edge-defined film fed grown (EFG) silicon wafer, string ribbon silicon, float zone (FZ) silicon, Czochralski (CZ) grown silicon, cast multi-crystalline silicon (mc-Si), a monocrystalline silicon, epitaxially grown silicon layer, or another silicon structure or type.

In some cases, formation of a solar cell from a textured/etched silicon wafer may involve the following or other processes known to those skilled in the art. Formation of an emitter may involve the diffusion of phosphorus or similar material through the etched surface (e.g., from a spin-on dopant). The doping source may be removed by further etching in concentrated HF or the like, and the result of the diffusion may be the formation of n-type regions prior to performing surface passivation or may be retained with passivation performed through such a diffusion resultant or dopant-containing layer (e.g., PSG layer). Surface passivation may be provided by oxidizing (e.g., with $O_2$ or water vapor or the like), which may provide a dry oxide layer with an annealed interface to the silicon to reduce the surface recombination at the heavily doped emitters. A back contact may then be formed by removing the passivating oxide from the back surface of the silicon wafer or substrate (if necessary) and then applying a layer of aluminum or other similar metal and a silver or similar metal onto these back surfaces such as by vacuum evaporation, screen printing, or the like. Next, a front contract grid may be formed such as by opening an array of slits in the passivating oxide on the front or textured surface side of the wafer/substrate and then covering these slits with Ti or the like such as by vacuum evaporation and lift-off of photoresist. In other cases, though, front contacts are formed using screen printed Ag, and, in some embodiments, a technology is used for firing through the $SiO_2$ passivation such as that used for one-step contact firing of front and back pastes. The solar cell may be further processed or be assembled with other cells to make solar modules, which in turn may be linked to form photovoltaic arrays. Of course, this is just one simplified method of fabricating a solar cell and it may be modified to form a cell with a black etched surface described herein or other techniques well known in the industry, such as screen printing or ink-based printing, may be used in its place.

The following discussion describes a wet-chemical method that is particularly well suited for producing black silicon surfaces that exhibit nearly complete suppression of reflectivity in the wavelength range of 350 to 1000 nm. The processes described herein are believed useful with many silicon substrates such as single-crystal p-type Czochralski, {(100) and (111)}, n and p-type Float Zone, intrinsic, n and p-doped amorphous, and p-doped multi-crystalline as well as other silicon surfaces.

In one implementation, the catalytic solution may be a dilute (e.g., less than about 2 mM or, in some cases, less than about 1 mM) solutions of gold, silver, platinum, and other ions that may be presented in the form of $HAuCl_4$, AgF, and the like. This catalytic solution is added to the oxidant-etchant solution and these solutions combine under agitation to form an etch solution that etches a silicon surface. The etch time was significantly reduced relative to prior etching techniques such as less than about 4 minutes (e.g., 2 to 4 minutes or a similar time frame) to obtain a minimum achievable reflectivity (e.g., less than about 3% such as 1 to 2% or even as low as 0.2 to 0.4% in some cases such as those using gold as the catalyst) and also to achieve a relatively uniform surface texture. Such etching results were found to be achievable for both multi-crystalline and single crystalline silicon wafers of all orientations. Further, amorphous silicon layers approximately 1 micrometer thick required only about 90 seconds to achieve minimum achievable reflectance.

Regarding agitation/stirring during the etching process, both magnetic stirring and ultrasonication (e.g., 125 W or the like) may be utilized for solution mixing during the etching reactions. Magnetic stirring generally may yield wafers with a flatter reflectivity profile over the 350 to 1000 nm wavelength range. However, magnetic stirring may not yield wafers or silicon surfaces with the minimum achievable reflectivity in the middle of this wavelength range and may be ineffective for initiation of certain black etch procedures depending upon the catalytic nanomaterial utilized. Ultrasonication or ultrasonic agitation, or higher or lower frequency agitation, hence, may be more useful in some applications.

The oxidant-etchant solution generally may include an etching agent chosen for silicon and a silicon oxidizing agent whose decomposition can be catalyzed by the chosen catalytic metal. In one embodiment, HF is used as the etching agent while $H_2O_2$ is the oxidizing agent with the balance of the etching solution volume being deionized water. The specific make up of the oxidant-etchant solution may vary widely to practice the described etching such as 5 to 15% w/w HF, 15 to 30% $H_2O_2$ with the balance being DI $H_2O$. For example, an oxidant-etchant solution (sometimes referred herein to as a 2× strength oxidant-etchant solution) may be formed with 6.25% w/w HF, 18.75% w/w $H_2O_2$, and balance DI $H_2O$ while in another case a oxidant-etchant solution with 26.25% $H_2O_2$ and 6.25% HF may be used and found effective when the wafers are deeply doped (e.g., n-doping may require longer etch times such as up to 8 minutes or more and/or higher etching solution temperatures such as up to about 45° C. or more). The final etching solution is somewhat more diluted due to the combination with the solution provided with the catalytic nanomaterial. For example, the etching solution may include equal volumes of the oxidant-etchant solution and the catalytic nanomaterial solution (e.g., a metal colloid solution), and in the above specific example, this yields an etching solution of 3.125% w/w HF, 9.375% w/w $H_2O_2$ and DI $H_2O$ to provide a volume ratio of 1:5:2 of HF:$H_2O_2$:DI $H_2O$.

A wide variety of silicon wafers may be etched as described herein with some testing being performed on 1 square inch Czochralski wafers that were polished on one side. The wafers may be n-type or p-type with a wide range of doping (e.g., 0.25 ohm-cm to about 50 ohm-cm or the like). In particular embodiments, the resistivities of p-doped CZ, FZ, and multi-crystalline wafers (excluding tested undoped-pCZ<1,0,0> wafers) were between about 1 and about 3 ohm-cm. Also, p-doped CZ<3,1,1> wafers were tested that had a resistivity of about 0.5 ohm-cm. Further, tests were performed using p-doped CZ<1,1,1> wafers with a resistivity in the range of about 0.2 to about 0.25 ohm-cm. The volume of volume of the etching solution used may be about 5 ml to about 15 ml per square inch of silicon wafer or silicon surface with 10 ml reactant per square inch of wafer being used in some cases, but, of course, the volume may be optimized or selected to suit the size/shape of the reactant vessel and size and number of the silicon wafers processed in each batch and based on other variables. The stripping solution used to remove remaining nanoparticles after etch is complete may also vary to practice the process and is typically selected based on a number of factors such as to provide a chemistry suitable for the catalytic nanomaterial. When the nanoparticles are silver or gold, the stripping solution may be 25 g $I_2$/100 g KI per liter of DI $H_2O$ or aqua regia or the like, and the stripping or metal removal time, agitation technique, and volume of stripping solution may be similar or even the same as used in the etching process.

With respect to time, the stability of the pre-mixed etching solution formed with $HAuCl_4$ solution may be relatively short such as about 2 minutes at room temperature, and after this time, gold nanoparticles may form such as by the in-situ reduction of $Au^{3+}$ by $H_2O_2$, rendering the pre-mixed etching solution inactive or less active with respect to achieving black etching. Hence, it may be desirable to combine the catalytic solution with the oxidant-etchant solution in the vessel in the presence of the silicon surfaces to be etched or forming the etching solution and then promptly placing this solution in the vessel containing the silicon wafer(s). One useful procedure entails placing the Si wafer in the $HAuCl_4$ solution prior to the addition of the 2× strength oxidant-etchant solution and then performing concurrent or subsequent ultrasonication such as for about 3 to 4 minutes or longer. In one implementation/experiment, the size of the resultant "Purple of Cassius" gold particles from catalytic solutions of 0.4 mM $HAuCl_4$:2× strength black etch after 4-minute etching was determined by TEM to be less than about 10 nm. XPS spectroscopy revealed that the gold particles did not contain Au(I) ions, (e.g., from AuF) but only or mainly $Au^0$.

One useful catalytic concentration of $HAuCl_4$ has been determined via iterative experiments to be about 0.0775 mM for p-CZ<1,0,0> wafers while about 0.155 mM was useful for p-doped CZ<1,1,1> and <3,1,1> wafers and about 0.31 mM was found desirable for p-multi-crystalline wafers. In some experiments, p-FZ wafers and un-doped p-CZ<1,1,1>, {*R 75 Ω-cm} silicon surface were better etched with a catalytic solution containing a minimum $HAuCl_4$ of about 0.04 mM. Hence, wafers containing excess positive carriers and, in some cases, having a lower sheet resistance may be better or completely black etched or textured with a higher $HAuCl_4$ concentration or amount provided in the etching solution.

While a number of exemplary aspects and embodiments have been discussed above, those of skill in the art will recognize certain modifications, permutations, additions, and sub-combinations thereof. It is therefore intended that the following appended claims and claims hereafter introduced are interpreted to include modifications, permutations, additions, and sub-combinations to the exemplary aspects and embodiments discussed above as are within their true spirit and scope. For example, numerous other methods may be used to form the graded-density AR surface or region that is later processed to provide surface passivation as described and claimed herein. However, it may be useful to summarize an additional approach to forming a black silicon region or surface on a silicon substrate, device, or wafer.

In another exemplary technique, texturing or black etching a silicon surface such as the surface of a silicon wafer is performed to provide a graded-density AR surface or region. The method includes positioning a silicon wafer, or a silicon layer on a substrate, with at least one polished silicon surface in a vessel or container. The method also includes filling the vessel with a volume of an etching solution so as to cover the silicon surface of the wafer or layer. The etching solution is made up of a catalytic nanomaterial and an oxidant-etchant solution. The catalytic nanomaterial may include, for example, 2 to 30 nm Au nanoparticles, 2 to 30 nm Ag nanoparticles, and/or noble metal nanoparticles, which may be provided in a colloidal solution. The oxidant-etchant solution is formed with an etching agent, such as HF, and an oxidizing agent (e.g., a silicon oxide or simply silicon oxidizing agent), which may be, for example, one of $H_2O_2$, $O_3$, $CO_2$, $K_2Cr_2O_7$, $CrO_3$, $KIO_3$, $KBrO_3$, $NaNO_3$, $HNO_3$, and $KMnO_4$, or other suitable oxidizing agents.

Etching is performed for a length of time by agitating or stirring the etching solution in the vessel. The texturing method to provide the graded-density AR surface or region may be thought of as a one-step or reduced steps process because there is no requirement that the silicon surface be coated with a metal catalyst prior to etching, and in practice the filling and etching step may be performed substantially concurrently. Further, in some cases, the three ingredients or components of the etching solution (e.g., the source of nanoparticles, the etching agent, and the oxidizing agent) may be pre-mixed or placed in the vessel to be combined by agitating or stirring in the vessel.

The etch time or length of time of the etching is typically relatively short such as less than about 15 minutes and may be selected such that the etched silicon surface has a reflectivity of less than about 15 percent (and even less than 10 percent or lower) in a wavelength range of about 350 to about 1000 nanometers. The etch time may also or alternatively be selected to etch or create a certain roughening or tapered/textured surface such as may be characterized as having a plurality of tunnels or etch pits having depths in the range of about 300 to 500 nanometers and, in some cases, having diameters that, at least toward the silicon surface, are greater than about 5 to 10 times the size of nanoparticles provided by the catalytic nanomaterial. The silicon surface may vary such as to be monocrystalline, multicrystalline, or amorphous, and the surface may include various amounts of doping (e.g., p-type or n-type doping). The etch time may also be reduced by raising the temperatures used during this processing.

What is claimed is:

1. A method of processing a silicon surface to provide surface passivation for high-efficiency silicon-based devices, comprising:
    positioning a substrate with a silicon surface in a chamber, wherein the silicon surface comprises graded-density silicon to provide an anti-reflection surface;
    heating the chamber to a temperature within a high-temperature processing range;
    forming an emitter junction proximate the silicon surface by doping the substrate, wherein a dopant-containing precursor is in communication with the chamber or was previously formed on the silicon surface;
    forming a passivation layer on the graded-density silicon antireflection surface, wherein the chamber is maintained at a temperature within the high-temperature processing range, wherein a dopant-containing layer is formed on the silicon surface during or prior to the emitter junction forming and wherein the formation of the passivation layer is performed with the dopant-containing layer in place on the substrate; and
    forming a contact on the substrate after forming the passivation layer without removing dopant materials.

2. The method of claim 1, wherein the dopant containing precursor comprises $POCl_3$ and wherein the passivation layer forming includes inputting oxygen, water vapor, or another oxygen source into the chamber, whereby the passivation layer comprises silicon dioxide and wherein the dopant containing layer comprises phosphorus silicate glass.

3. The method of claim 1, wherein the high-temperature range is 700 to 1250° C.

4. The method of claim 1, wherein the dopant containing precursor is selected from the group consisting of boron nitride, $POCl_3$, $BBr_3$, $PH_3$, $B_2H_6$, GaN, $AsH_3$, $SbH_3$, TMB, and spin-on dopants for B, Ga, P, or Sb.

5. The method of claim 1, wherein the passivation layer forming comprises inputting a passivation source into the chamber, the passivation source selected from the group consisting of oxygen, ammonia, $N_2O$, water vapor, and an aluminum precursor.

6. The method of claim 1, wherein the emitter junction forming and the passivation layer forming are performed at least partially concurrently.

7. The method of claim 1, wherein the passivation layer has a thickness of about 10 to 30 nm or more.

8. A method of forming a high-efficiency silicon-based device, comprising:
  providing a device with a silicon surface with a density gradient reducing reflectivity of the silicon surface; wherein the density gradient is formed in the silicon surface by a texturing process, the texturing process comprising the steps of:
    exposing the device to a volume of oxidant-etchant solution in the container, wherein the oxidant-etchant solution comprises an etching agent and an oxidizing agent and a plurality of catalytic metal particles present in situ or in the solution; and
    heating a processing chamber to a temperature of at least about 700° C.;
  forming an emitter junction proximate to the silicon surface by doping the device, wherein a dopant-containing a precursor is in communication with the processing chamber or was previously formed on the silicon surface, and a dopant-containing layer is formed on the silicon surface during or prior to the emitter junction forming; and
  performing surface passivation of the silicon surface by inputting oxygen or water vapor into the chamber with the chamber maintained at or above the temperature, whereby a passivation layer of silicon dioxide is formed on the silicon surface without dopant oxide stripping, wherein the passivation layer is formed with the dopant-containing layer in place on the device.

9. The method of claim 8, wherein the emitter junction is an emitter homo-junction in the device formed by doping the silicon surface.

10. The method of claim 9, wherein the emitter homo-junction forming is performed prior to the formation of the passivation layer.

11. The method of claim 10, wherein the dopant containing layer is formed on the silicon surface during the emitter homo-junction forming.

12. The method of claim 10, wherein the emitter homo-junction forming includes providing the dopant-containing precursor in contact with the silicon surface, wherein the dopant-containing precursor is selected from the group consisting of boron nitride, $POCl_3$, $BBr_3$, $PH_3$, $B_2H_6$, GaN, $AsH_3$, $SbH_3$, TMB, and spin on dopants for B, Ga, P, or Sb.

13. The method of claim 8, further comprising forming front and back contacts on the device, whereby a high-efficiency solar cell is formed.

14. The method of claim 8, wherein the passivation layer has a thickness of about 10 to 30 nm or more.

15. A method of processing a silicon surface to provide surface passivation for high-efficiency silicon-based devices, comprising:
  positioning a substrate with a silicon surface in a chamber, wherein the silicon surface comprises an anti-reflection surface;
  heating the chamber to a temperature within a high-temperature processing range;
  forming an emitter junction by doping the substrate with a dopant-containing precursor; and
  forming a passivation layer on the anti-reflection surface, wherein a dopant-containing layer is formed on the silicon surface, wherein the passivation layer forming is performed with the dopant-containing layer in place on the substrate, the passivation layer forming includes inputting oxygen, water vapor, or another oxygen source into the chamber, whereby the passivation layer comprises silicon dioxide and wherein the dopant-containing layer comprises phosphorus silicate glass.

16. The method of claim 15, further comprising forming front and back contacts on the substrate after forming the passivation layer without removing the passivation layer.

17. The method of claim 15, wherein the dopant containing precursor is selected from the group consisting of boron nitride, $POCl_3$, $BBr_3$, $PH_3$, $B_2H_6$, GaN, $AsH_3$, $SbH_3$, TMB, and spin-on dopants for B, Ga, P, or Sb.

18. The method of claim 15, wherein the passivation layer forming comprises inputting a passivation source into the chamber, the passivation source selected from the group consisting of oxygen and water vapor.

19. The method of claim 15, wherein the emitter junction forming and the passivation layer forming are performed at least partially concurrently.

20. The method of claim 19, wherein the dopant-containing precursor is selected from the group consisting of boron nitride, $POCl_3$, $BBr_3$, $PH_3$, $B_2H_6$, GaN, $AsH_3$, $SbH_3$, TMB, and spin-on dopants for B, Ga, P, or Sb.

21. The method of claim 20, wherein the passivation layer forming comprises inputting a passivation source into the chamber, the passivation source selected from the group consisting of oxygen and water vapor.

22. The method of claim 15, wherein the passivation layer has a thickness of about 10 to 30 nm or more.

* * * * *